(12) United States Patent
Bedeschi et al.

(10) Patent No.: US 12,249,362 B2
(45) Date of Patent: Mar. 11, 2025

(54) SINGLE PLATE CONFIGURATION AND MEMORY ARRAY OPERATION

(71) Applicant: Micron Technology, Inc., Boise, ID (US)

(72) Inventors: Ferdinando Bedeschi, Biassono (IT); Efrem Bolandrina, Fiorano Al Serio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/120,133

(22) Filed: Mar. 10, 2023

(65) Prior Publication Data
US 2023/0206977 A1 Jun. 29, 2023

Related U.S. Application Data

(60) Division of application No. 16/983,469, filed on Aug. 3, 2020, now Pat. No. 11,626,151, which is a
(Continued)

(51) Int. Cl.
*G11C 11/22* (2006.01)
*G06F 13/16* (2006.01)

(52) U.S. Cl.
CPC ...... *G11C 11/2259* (2013.01); *G06F 13/1694* (2013.01); *G11C 11/221* (2013.01); *G11C 11/2255* (2013.01); *G11C 11/2257* (2013.01)

(58) Field of Classification Search
CPC ............. G11C 11/2259; G11C 11/221; G11C 11/2255; G11C 11/2257
(Continued)

(56) References Cited

U.S. PATENT DOCUMENTS 3,618,053 A * 11/1971 Hudson ................. G11C 11/402
365/150
4,039,861 A * 8/1977 Heller ................... G11C 11/404
327/213
(Continued)

FOREIGN PATENT DOCUMENTS

| CN | 1189234 A | 7/1998 |
|----|-----------|--------|
| CN | 1534782 A | 10/2004 |

(Continued)

OTHER PUBLICATIONS

China National Intellectual Property Administration, "First Office Action," issued in connection with Chinese Patent Application No. 202010661904.4, dated Jul. 15, 2021 (5 pages).
(Continued)

*Primary Examiner* — Sung Il Cho
(74) *Attorney, Agent, or Firm* — Holland & Hart LLP

(57) ABSTRACT

Methods, systems, and devices for a single plate configuration and memory array operation are described. A nonvolatile memory array may utilize a single plate to cover a subset of the array. One or more memory cells of the subset may be selected by operating the plate and an access line of an unselected memory cell at a fixed voltage. A second voltage may be applied to an access line of the selected cell, and subsequently reduced to perform an access operation. Removing the applied voltage may allow for the memory cell to undergo a recovery period prior to a subsequent access operation.

19 Claims, 10 Drawing Sheets

Related U.S. Application Data continuation of application No. 15/845,893, filed on Dec. 18, 2017, now Pat. No. 10,762,944.

(58) Field of Classification Search
USPC .................................................. 365/145
See application file for complete search history.

(56) References Cited

U.S. PATENT DOCUMENTS

| | | |
|---|---|---|
| 5,307,304 A | 4/1994 | Saito et al. |
| 5,615,144 A | 3/1997 | Kimura et al. |
| 5,638,318 A | 6/1997 | Seyyedy |
| 5,831,895 A | 11/1998 | Manning |
| 6,028,783 A | 2/2000 | Allen et al. |
| 6,038,160 A | 3/2000 | Nakane et al. |
| 6,097,624 A | 8/2000 | Chung et al. |
| 6,208,550 B1 * | 3/2001 | Kim ............... G11C 11/22 365/230.06 |
| 6,233,170 B1 | 5/2001 | Yamada |
| 6,256,220 B1 * | 7/2001 | Kamp ............... H10B 53/00 365/175 |
| 6,363,002 B1 | 3/2002 | Nishimura et al. |
| 6,396,730 B1 | 5/2002 | Lin et al. |
| 6,771,531 B2 | 8/2004 | Nishihara |
| 6,804,138 B2 | 10/2004 | Thompson et al. |
| 6,809,954 B1 | 10/2004 | Madan et al. |
| 7,133,304 B2 | 11/2006 | Madan et al. |
| 7,649,763 B2 | 1/2010 | Takashima |
| 9,613,676 B1 | 4/2017 | Wang et al. |
| 9,715,918 B1 | 7/2017 | Kawamura |
| 9,761,312 B1 | 9/2017 | Kajigaya |
| 9,767,880 B1 | 9/2017 | Carman |
| 9,786,345 B1 | 10/2017 | Thiruvengadam et al. |
| 9,786,348 B1 | 10/2017 | Kawamura et al. |
| 10,074,414 B2 | 9/2018 | Derner et al. |
| 10,153,018 B2 | 12/2018 | Derner et al. |
| 10,504,909 B2 | 12/2019 | Vimercati |
| 11,315,617 B2 | 4/2022 | Vimercati |
| 11,626,151 B2 | 4/2023 | Bedeschi et al. |
| 2001/0040815 A1 | 11/2001 | Tanaka |
| 2002/0075736 A1 | 6/2002 | Kumura et al. |
| 2002/0079520 A1 | 6/2002 | Nishihara et al. |
| 2002/0080664 A1 | 6/2002 | Takashima |
| 2003/0053327 A1 | 3/2003 | Kang et al. |
| 2003/0185039 A1 | 10/2003 | Komatsuzaki |
| 2004/0125682 A1 | 7/2004 | Takashima |
| 2004/0213033 A1 | 10/2004 | Maruyama |
| 2004/0240250 A1 * | 12/2004 | Karasawa ............... G11C 11/22 365/145 |
| 2004/0245547 A1 | 12/2004 | Stipe |
| 2005/0063214 A1 | 3/2005 | Takashima |
| 2005/0201137 A1 | 9/2005 | Mukaiyama |
| 2005/0243593 A1 | 11/2005 | Sakuma |
| 2006/0056225 A1 | 3/2006 | Hashimoto et al. |
| 2006/0146590 A1 | 7/2006 | Fukushi et al. |
| 2006/0279977 A1 * | 12/2006 | Shiga ............... G11C 11/22 365/145 |
| 2006/0285378 A1 | 12/2006 | Yamaoka et al. |
| 2009/0010037 A1 | 1/2009 | Kang et al. |
| 2009/0103348 A1 | 4/2009 | Du |
| 2009/0168490 A1 | 7/2009 | Madan |
| 2009/0231902 A1 | 9/2009 | Takashima |
| 2010/0025747 A1 | 2/2010 | Fukada |
| 2010/0097839 A1 | 4/2010 | Kim |
| 2010/0321975 A1 | 12/2010 | Kimura et al. |
| 2010/0321988 A1 | 12/2010 | Wells et al. |
| 2012/0127776 A1 | 5/2012 | Kawashima |
| 2012/0275250 A1 | 11/2012 | Kim |
| 2014/0239512 A1 | 8/2014 | Pellizzer et al. |
| 2014/0241076 A1 | 8/2014 | Kwon et al. |
| 2014/0254267 A1 | 9/2014 | Sakui et al. |
| 2015/0309743 A1 | 10/2015 | Sohn et al. |
| 2017/0084335 A1 | 3/2017 | Hahn et al. |
| 2017/0133099 A1 | 5/2017 | Hsu |
| 2017/0263304 A1 | 9/2017 | Vimercati |
| 2017/0270991 A1 | 9/2017 | Kawamura et al. |
| 2017/0352397 A1 | 12/2017 | Guo et al. |
| 2017/0352398 A1 | 12/2017 | Kawamura |
| 2018/0025766 A1 | 1/2018 | Dietrich et al. |
| 2018/0033486 A1 | 2/2018 | Chen |
| 2018/0190363 A1 | 7/2018 | Lee |
| 2018/0226116 A1 | 8/2018 | Derner et al. |
| 2018/0331114 A1 | 11/2018 | Vimercati |
| 2019/0189177 A1 | 6/2019 | Bedeschi et al. |
| 2019/0189190 A1 | 6/2019 | Di et al. |
| 2019/0206455 A1 | 7/2019 | Bedeschi et al. |
| 2020/0051607 A1 | 2/2020 | Pan et al. |

FOREIGN PATENT DOCUMENTS

| | | |
|---|---|---|
| CN | 101853696 A | 10/2010 |
| CN | 101960531 A | 1/2011 |
| CN | 109074836 A | 12/2018 |
| CN | 109390007 A | 2/2019 |
| CN | 109961809 A | 7/2019 |
| EP | 1492124 A2 | 12/2004 |
| JP | 2000-187990 A | 7/2000 |
| JP | 2000-285682 A | 10/2000 |
| JP | 2002-026277 A | 1/2002 |
| JP | 2003-187571 A | 7/2003 |
| JP | 2004-362753 A | 12/2004 |
| JP | 2005-085431 A | 3/2005 |
| JP | 2005-209324 A | 8/2005 |
| JP | 2006-164368 A | 6/2006 |
| JP | 2007-149295 A | 6/2007 |
| JP | 2009-217906 A | 9/2009 |
| JP | 2019-521464 A | 7/2019 |
| JP | 2020-509523 A | 3/2020 |
| KR | 10-2018-0117200 A | 10/2018 |
| WO | 2017/205007 A1 | 11/2017 |
| WO | 2018/148064 A1 | 8/2018 |

OTHER PUBLICATIONS

Chinese Patent Office, "Office Action and Search Report", issued in connection with Chinese Patent Application No. 201811548278.7 dated Oct. 27, 2022 (19 pages).

Chinese Patent Office, "Chinese Office Action," issued in connection with Chinese Patent Application No. 201811541633.8 dated Nov. 2, 2022 (11 pages).

European Patent Office, "Extended Search Report," issued in connection with European Patent Application No. 18799187.2, dated Apr. 21, 2021 (10 pages).

European Patent Office, "Partial Search Report," issued in connection with European Patent Application No. 18799187.2, dated Jan. 20, 2021 (12 pages).

Grant of Patent received for Korean Patent Application No. 10-2019-7035115, mailed on Dec. 20, 2021, 3 pages (2 pages of English Translation and 1 page of Original Document).

International Search Report and Written Opinion received for PCT Patent Application No. PCT/US2018/031745, mailed on Sep. 11, 2018, 13 pages.

IPO, "Office Action," issued in connection with ROC (Taiwan) Patent Application No. 107115661, dated Mar. 4, 2019 (5 pages).

JPO, "Notice of Rejection Ground," issued in connection with Japanese Patent Application No. 2019-561154, dated Oct. 13, 2020 (6 pages).

Korea Patent Office, "Notice of Allowance," issued in connection with Korea Patent Application No. 10-2020-0082052, dated Nov. 22, 2021 (4 pages).

Korean Intellectual Property Office, "Notice of Reasons for Rejection," issued in connection with Korean Patent Application No. 10-2020-0082052, dated Apr. 30, 2021 (4 pages).

Office Action received for Japanese Patent Application No. 2021-016814, mailed on Feb. 22, 2022, 17 pages (9 pages of English Translation and 8 pages of Original Document).

Office Action received for Korean Patent Application No. 10-2020-0082052, mailed on Nov. 22, 2021, 4 pages (2 pages of English Translation and 2 pages of Original Document).

(56) References Cited

OTHER PUBLICATIONS

The Korean Intellectual Property Office, "Notice of Reasons for Rejection," issued in connection with Korean Patent Application No. 10-2019-7035115, dated Oct. 26, 2020 (4 pages).
Toshiyuki Nishihara et al: "A Quasi-Matrix Ferroelectric Memory for Future Silicon Storage", IEEE Journal of Solid-State Circuits, IEEE, USA, vol. 37, No. 11, Nov. 1, 2002 (Nov. 1, 2002), XP011065880.
U.S. Appl. No. 62/381,879, filed Aug. 31, 2016.
U.S. Appl. No. 62/504,299, filed May 19, 2017.
U.S. Appl. No. 62/381,942, filed Aug. 31, 2016.

* cited by examiner

SINGLE PLATE CONFIGURATION AND MEMORY ARRAY OPERATION

CROSS REFERENCE

The present Application for Patent is a divisional of U.S. patent application Ser. No. 16/983,469 by Bedeschi et al., entitled "SINGLE PLATE CONFIGURATION AND MEMORY ARRAY OPERATION," filed Aug. 3, 2020, which is a continuation of U.S. patent application Ser. No. 15/845,893 by Bedeschi et al., entitled "SINGLE PLATE CONFIGURATION AND MEMORY ARRAY OPERATION," filed Dec. 18, 2017, each of which is assigned to the assignee hereof, and each of which is expressly incorporated by reference in its entirety herein.

BACKGROUND

The following relates generally to operating a memory array and more specifically to a single plate configuration and memory array operation.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device. FeRAM devices may thus have improved performance compared to other non-volatile and volatile memory devices.

Improving memory devices, generally, may include increasing memory cell density, increasing read/write speeds, increasing reliability, increasing data retention, reducing power consumption, or reducing manufacturing costs, among other metrics. In some devices, having a number of plates associated with a memory array may result in increased power consumption and inhibited performance, among other challenges.

DETAILED DESCRIPTION

Memory devices may consume a certain amount of power when multiple plate drivers are activated to facilitate cell access (e.g., reading from or writing to a cell). Power consumption for plate driver activation may increase with the number of plate drivers utilized, e.g., additional plates require additional plate drivers, which increases power consumption. Thus a reduction in the amount of plate drivers utilized by a memory device results in significant power reduction when a large number of memory cells are coupled with a single plate.

A memory array with ferroelectric cells may utilize a single plate to cover a subset of the array. This may allow for the portions of the array associated with the single plate to utilize fewer plate drivers, which may mitigate power consumption of the array. Additionally, fewer plate drivers may reduce the amount of routing needed to accommodate the drivers, which may result in increased read and write speeds.

When utilizing a single plate across a subsection of a memory array, one or more access lines of the memory array may be coupled with the plate during some time intervals of the operation. By coupling the plate with access line, both may be operated at a same, fixed voltage. By operating the plate at a fixed voltage, the need for multiple plate drivers is reduced. A memory cell coupled with a second, different access line may then be selected by applying a second voltage to the second access line and subsequently reducing the applied voltage to access the cell. This configuration may allow for an unselected access line to be coupled with the plate line, which may result in increased read and write speeds to and from the selected memory cell, all while power consumption of the array is mitigated.

In some examples, a memory cell of a subsection of a memory array utilizing a single plate may be accessed (e.g., read from, written to). To access such a memory cell, a first voltage may be applied to the plate and a first access line coupled with a first memory cell. A second voltage may be applied to a second access line coupled with a second memory cell, which may result in the second memory cell being selected. The second memory cell may be accessed, for example, by reducing the second voltage to a third voltage, which may be a lower voltage than the second voltage. After accessing the second memory cell, the second voltage may be removed from the second access line.

Features of the disclosure introduced above are further described below in the context of a memory array. Specific examples are then described for a memory array that supports a single plate configuration and memory array operation. These and other features of the disclosure are further illustrated by and described with reference to apparatus diagrams, timing diagrams, circuit diagrams, system diagrams, and flowcharts that relate to a single plate configuration and memory array operation.

Figure 1:
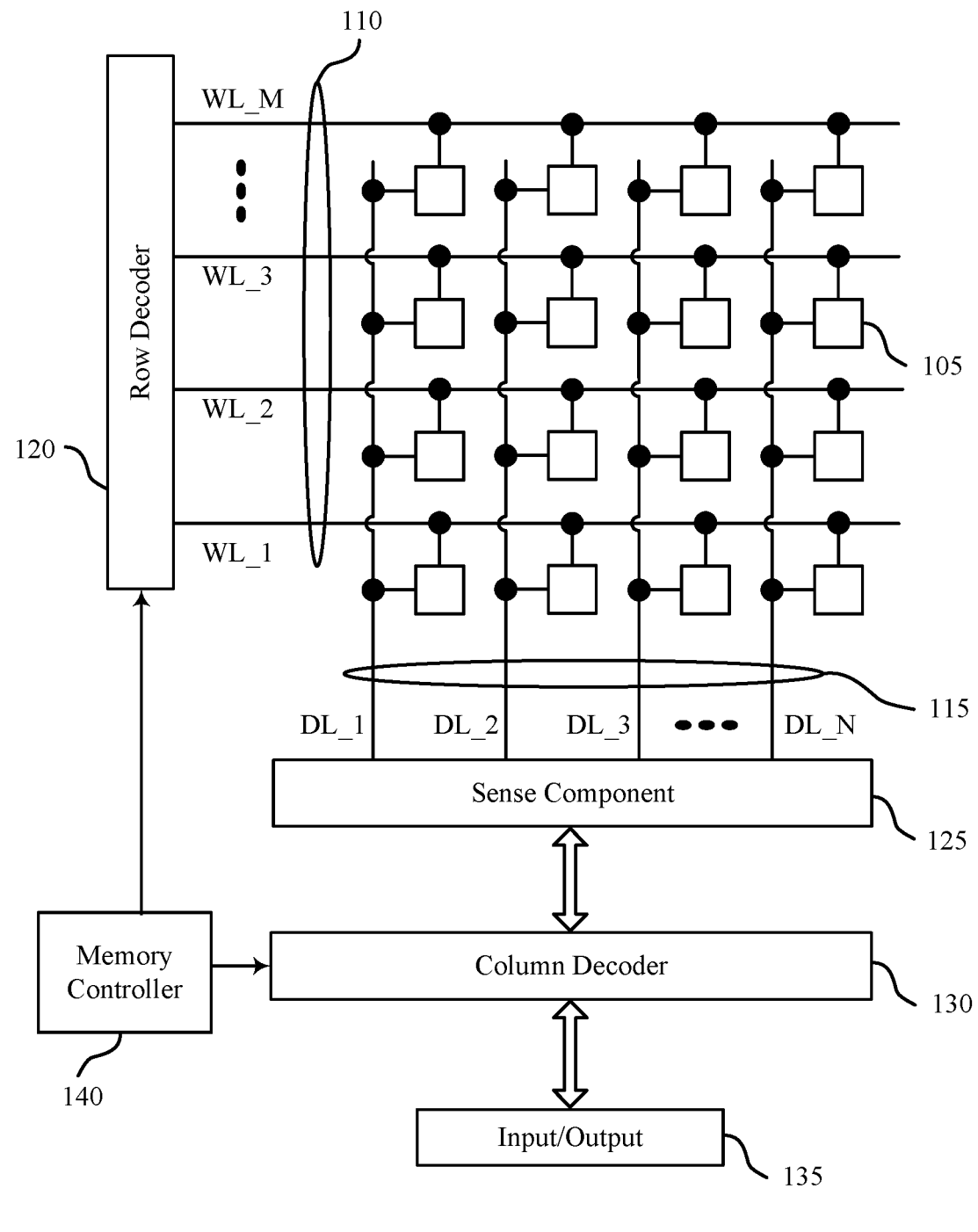
FIG. 1 illustrates an example memory array that supports a single plate configuration and memory array operation in accordance with examples of the present disclosure.

FIG. 1 illustrates an example memory array 100 in accordance with various examples of the present disclosure. Memory array 100 may also be referred to as an electronic memory apparatus. Memory array 100 includes memory cells 105 that are programmable to store different states. Each memory cell 105 may be programmable to store two states, denoted as a logic 0 and a logic 1. In some cases, memory cell 105 is configured to store more than two logic states. A memory cell 105 may store a charge representative of the programmable states in a capacitor; for example, a charged and uncharged capacitor may represent two logic states, respectively. DRAM architectures may commonly use such a design, and the capacitor employed may include a dielectric material with linear or para-electric electric polarization properties as the insulator. By contrast, a ferroelectric memory cell may include a capacitor with a ferroelectric as the insulating material. Different levels of charge of a ferroelectric capacitor may represent different logic states. Ferroelectric materials have non-linear polarization properties; some details and advantages of a ferroelectric memory cell 105 are discussed below.

Operations such as reading and writing may be performed on memory cells 105 by activating or selecting access line 110 and digit line 115. Access lines 110 may also be known as word lines 110, and bit lines 115 may also be known digit lines 115. References to word lines and bit lines, or their analogues, are interchangeable without loss of understanding or operation. Activating or selecting a word line 110 or a digit line 115 may include applying a voltage to the respective line. Word lines 110 and digit lines 115 may be made of conductive materials such as metals (e.g., copper (Cu), aluminum (Al), gold (Au), tungsten (W), etc.), metal alloys, carbon, conductively-doped semiconductors, or other conductive materials, alloys, compounds, or the like.

According to the example of FIG. 1, each row of memory cells 105 is connected to a single word line 110, and each column of memory cells 105 is connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105.

Memory array 100 may be a two-dimensional (2D) memory array or a three-dimensional (3D) memory array. A 3D memory array may include two-dimensional (2D) memory arrays formed on top of one another. This may increase the number of memory cells that may be placed or created on a single die or substrate as compared with 2D arrays, which in turn may reduce production costs or increase the performance of the memory array, or both. Memory array 100 may include any number of levels. Each level may be referred to as a deck and may be aligned or positioned so that memory cells 105 may be approximately aligned with one another across each deck.

Each row of memory cells 105 may be connected to a single word line 110, and each column of memory cells 105 may be connected to a single digit line 115. In some examples, the word line 110 and the digit line 115 may be referred to as access lines. For example, a digit line 115 of memory array 100 may be referred to as a first access line 115 and a word line 110 of memory array 100 may be referred to as a second access line 110. In some examples, the first access line may be coupled with a first memory cell 105 and the second access line may be coupled with a second memory cell 105. In the example depicted in FIG. 1, memory array 100 includes one deck of memory cells 105 and may thus be considered a two-dimensional memory array; however, the number of decks is not limited. By activating one word line 110 and one digit line 115 (e.g., applying a voltage to the word line 110 or digit line 115), a single memory cell 105 may be accessed at their intersection. Additionally, for example, in a 3D memory array, each deck in a row may have common conductive lines such that each deck may share word lines 110 or digit lines 115 or contain separate word lines 110 or digit lines 115. Thus in a 3D configuration one word line 110 and one digit line 115 of a same deck may be activated to access a single memory cell 105 at their intersection. The intersection of a word line 110 and digit line 115, in either a 2D or 3D configuration, may be referred to as an address of a memory cell.

In some architectures, the logic storing device of a cell, e.g., a capacitor, may be electrically isolated from the digit line by a selection component. The word line 110 may be connected to and may control the selection component. For example, the selection component may be a transistor and the word line 110 may be connected to the gate of the transistor. In other examples, the transistor may be a junction-less transistor. Activating the word line 110 results in an electrical connection or closed circuit between the capacitor of a memory cell 105 and its corresponding digit line 115. The digit line may then be accessed to either read or write the memory cell 105.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate digit line 115. For example, memory array 100 may include multiple word lines 110, labeled WL_1 through WL_M, and multiple digit lines 115, labeled DL_1 through DL_N, where M and N depend on the array size. In some examples, each of word lines WL_1 through WL_M may be coupled with a separate row decoder. In other examples, each of word lines WL_1 through WL_M may be coupled with one row decoder. In either instance, by activating a word line 110 and a digit line 115, e.g., WL_2 and DL_3, the memory cell 105 at their intersection may be accessed.

Upon accessing, a memory cell 105 may be read, or sensed, by sense component 125 to determine the stored state of the memory cell 105. For example, after accessing the memory cell 105, the ferroelectric capacitor of memory cell 105 may discharge onto its corresponding digit line 115. Discharging the ferroelectric capacitor may result from biasing, or applying a voltage, to the ferroelectric capacitor. The discharging may cause a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa. Sense component 125 may include various transistors or amplifiers in order to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. In some examples, multiple digit lines 115 may be coupled with a sense component 125. For example, a first access line (e.g., a digit line 115) may be coupled with an additional digit line 115 via column decoder 130.

A memory cell 105 may be set, or written, by similarly activating the relevant word line 110 and digit line 115—i.e., a logic value may be stored in the memory cell 105. Column decoder 130 or row decoder 120 may accept data, for example input/output 135, to be written to the memory cells 105. A ferroelectric memory cell 105 may be written by applying a voltage across the ferroelectric capacitor. This process is discussed in more detail below.

The memory controller 140 may control the operation (e.g., read, write, re-write, refresh, discharge, etc.) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and digit line 115. Memory controller 140 may also generate and control various voltages or currents used during the operation of memory array 100. For example, it may apply discharge voltages to a word line 110 or digit line 115 after accessing one or more memory cells 105. In general, the amplitude, shape, or duration of an applied voltage or current discussed herein may be adjusted or varied and may be different for the various operations discussed in operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

In some examples, the memory controller 140 may be coupled with each of a first access line (e.g., a digit line 115) and a second access line (e.g., a word line 110). In some examples, the first access line may be coupled with a first memory cell 105 and the second access line may be coupled with a second memory cell 105. The memory controller 140 may be coupled with a plate line (not shown), that may be coupled with each of the first access line, the first memory cell 105, and the second memory cell 105. The memory controller 140 may be configured, for example, to apply a first voltage to the plate line and the first access line. Additionally or alternatively, for example, the memory controller 140 may apply a second voltage to the second access line, which may select the second memory cell 105. In some examples, the memory controller 140 may reduce the second voltage to a third voltage to access the second memory cell 105 and may, for example, remove the applied second voltage after accessing the second memory cell 105. Such an operation may result in less power consumption by memory array 100, as well as requiring fewer drivers (not shown) to operate various aspects of memory array 100.

Figure 2:
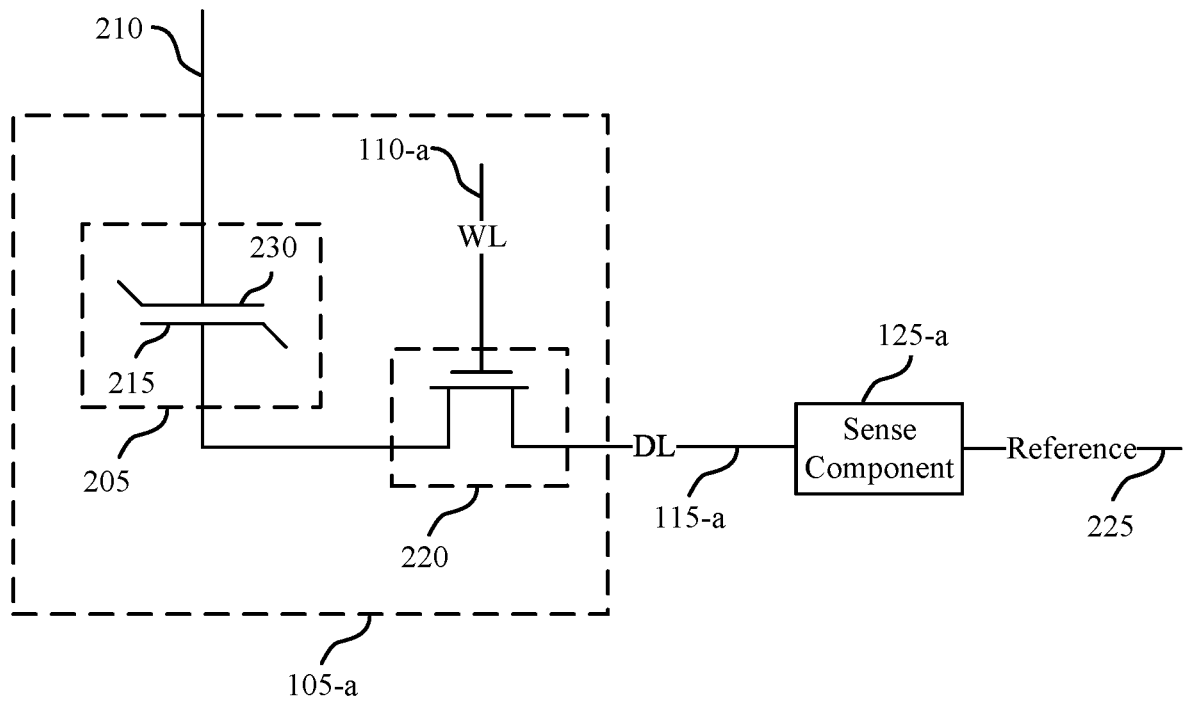
FIG. 2 illustrates an example circuit that supports a single plate configuration and memory array operation in accordance with examples of the present disclosure.

FIG. 2 illustrates an example circuit 200 in accordance with various examples of the present disclosure. Circuit 200 includes a memory cell 105-*a*, word line 110-*a*, digit line 115-*a*, and sense component 125-*a*, which may be examples of a memory cell 105, word line 110, digit line 115, and sense component 125, respectively, as described with reference to FIG. 1. Memory cell 105-*a* may include a logic storage component, such as capacitor 205 that has a first plate, cell plate 230, and a second plate, cell bottom 215. Cell plate 230 and cell bottom 215 may be capacitively coupled through a ferroelectric material positioned between them. The orientation of cell plate 230 and cell bottom 215 may be flipped without changing the operation of memory cell 105-*a*. Circuit 200 also includes selection component 220 and reference line 225. Cell plate 230 may be accessed via plate line 210 and cell bottom 215 may be accessed via digit line 115-*a*. As described above, various states may be stored by charging or discharging capacitor 205. In some examples, plate line 210 may be coupled with multiple memory cells 105-*a*. For example, plate line 210 may be coupled with each of a first memory cell 105-*a* and a second memory cell (not shown). Additionally or alternatively, for example, plate line 210 may be coupled with a first access line (e.g., digit line 115-*a*).

The stored state of capacitor 205 may be read or sensed by operating various elements represented in circuit 200. Capacitor 205 may be in electronic communication with digit line 115-*a* and a plate line 210. For example, capacitor 205 can be isolated from digit line 115-*a* when selection component 220 is deactivated, and capacitor 205 can be connected to digit line 115-*a* when selection component 220 is activated. Activating selection component 220 may be referred to as selecting memory cell 105-*a*. In some cases, selection component 220 is a transistor and its operation is controlled by applying a voltage to the transistor gate, where the voltage magnitude is greater than the threshold magnitude of the transistor. Word line 110-*a* may activate selection component 220; for example, a voltage applied to word line 110-*a* is applied to the transistor gate, connecting capacitor 205 with digit line 115-*a*. In some examples, a first voltage may be applied to the plate line 210 and the first access line (e.g., digit line 115-*a*) that are each coupled with memory cell 105-*a*.

In some examples, a memory array (e.g., memory array 100 as described with reference to FIG. 1) may contain multiple word lines and one or more plate lines coupled with a memory cell. For example, as described above, word line 110-*a* and plate line 210 may be coupled with a memory cell 105-*a*, and a second word line (not shown) and a second plate line (not shown) may be coupled with a second memory cell (not shown). In other examples, the plate line 210 may be coupled with each of the first memory cell and the second memory cell. In some embodiments, one memory cell (such as the second memory cell) may be selected after applying a first voltage to the plate line 210 and the word line 110-*a* that are each coupled with the memory cell 105-*a*. This voltage may be referred to as a deselection voltage. In some examples, this voltage may be −1.7V.

The second memory cell may then be selected by applying a second voltage to the second word line coupled with the second memory cell. The second memory cell may be accessed (e.g., written to or read from) by reducing the second voltage to a third voltage. The third voltage may be a different voltage than the second voltage. During this time, the first voltage (e.g., the deselection voltage) may be applied to the plate line 210 and the word line 110-a (e.g., continually applied). After accessing the second memory cell, the second voltage may be removed from the second access line.

In other examples, the positions of selection component 220 and capacitor 205 may be switched, such that selection component 220 is connected between plate line 210 and cell plate 230 and such that capacitor 205 is between digit line 115-a and the other terminal of selection component 220. In this example, selection component 220 may remain in electronic communication with digit line 115-a through capacitor 205. This configuration may be associated with alternative timing and biasing for read and write operations.

Due to the ferroelectric material between the plates of capacitor 205, and as discussed in more detail below, capacitor 205 may not discharge upon connection to digit line 115-a. In one scheme, to sense the logic state stored by ferroelectric capacitor 205, word line 110-a may be biased to select memory cell 105-a and a voltage may be applied to plate line 210. In some cases, digit line 115-a is virtually grounded and then isolated from the virtual ground, which may be referred to as "floating," prior to biasing plate line 210 and word line 110-a. Biasing plate line 210 may result in a voltage difference (e.g., plate line 210 voltage minus digit line 115-a voltage) across capacitor 205. The voltage difference may yield a change in the stored charge on capacitor 205, where the magnitude of the change in stored charge may depend on the initial state of capacitor 205—e.g., whether the initial state stored a logic 1 or a logic 0. This may cause a change in the voltage of digit line 115-a based on the charge stored on capacitor 205. Operation of memory cell 105-a by varying the voltage to cell plate 230 may be referred to as "moving cell plate." In other examples, capacitor 205 may be discharged to remove a second voltage applied to a second access line (e.g., a second digit line 115 as described with reference to FIG. 1).

The change in voltage of digit line 115-a may depend on its intrinsic capacitance. That is, as charge flows through digit line 115-a, some finite charge may be stored in digit line 115-a and the resulting voltage depends on the intrinsic capacitance. The intrinsic capacitance may depend on physical characteristics, including the dimensions, of digit line 115-a. Digit line 115-a may connect many memory cells 105 so digit line 115-a may have a length that results in a non-negligible capacitance (e.g., on the order of picofarads (pF)). The resulting voltage of digit line 115-a may then be compared to a reference (e.g., a voltage of reference line 225) by sense component 125-a in order to determine the stored logic state in memory cell 105-a. Other sensing processes may be used.

Sense component 125-a may include various transistors or amplifiers to detect and amplify a difference in signals, which may be referred to as latching. Sense component 125-a may include a sense amplifier that receives and compares the voltage of digit line 115-a and reference line 225, which may be a reference voltage. The sense amplifier output may be driven to the higher (e.g., a positive) or lower (e.g., negative or ground) supply voltage based on the comparison. For instance, if digit line 115-a has a higher voltage than reference line 225, then the sense amplifier output may be driven to a positive supply voltage. In some cases, the sense amplifier may additionally drive digit line 115-a to the supply voltage. Sense component 125-a may then latch the output of the sense amplifier and/or the voltage of digit line 115-a, which may be used to determine the stored state in memory cell 105-a, e.g., logic 1. Alternatively, if digit line 115-a has a lower voltage than reference line 225, the sense amplifier output may be driven to a negative or ground voltage. Sense component 125-a may similarly latch the sense amplifier output to determine the stored state in memory cell 105-a, e.g., logic 0. The latched logic state of memory cell 105-a may then be output, for example, through column decoder 130 as output 135 with reference to FIG. 1.

To write memory cell 105-a, a voltage may be applied across capacitor 205. Various methods may be used. In one example, selection component 220 may be activated through word line 110-a in order to electrically connect capacitor 205 to digit line 115-a. A voltage may be applied across capacitor 205 by controlling the voltage of cell plate 230 (through plate line 210) and cell bottom 215 (through digit line 115-a). To write a logic 0, cell plate 230 may be taken high, that is, a positive voltage may be applied to plate line 210, and cell bottom 215 may be taken low, e.g., virtually grounding or applying a negative voltage to digit line 115-a. The opposite process is performed to write a logic 1, where cell plate 230 is taken low and cell bottom 215 is taken high. In other examples, as described above, a memory cell (e.g., a second memory cell) may be written to by first applying a first voltage to the plate line 210 and first access line 115-a that may each be coupled with a first memory cell 105-a. The second memory cell (not shown) may be selected by applying a second voltage to a second access line (e.g., a word line) that may be coupled with the second memory cell. The second memory cell may then be written to by reducing the second voltage to a third voltage. In some examples, the third voltage may be lower than the second voltage. In other examples, the third voltage may be a different voltage than the second voltage. Additionally or alternatively, for example, the second voltage may be removed after accessing the second memory cell, which may be achieved by discharging a capacitor (not shown) of the second memory cell.

Figure 3:
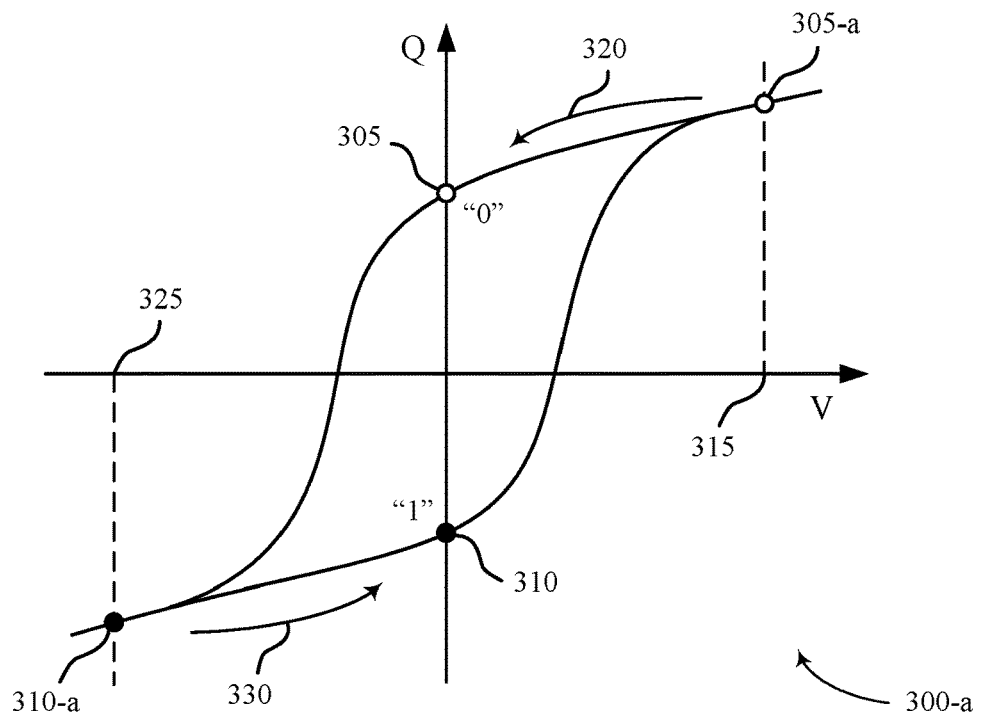
FIG. 3 illustrates an example hysteresis curves for a cell that supports a single plate configuration and memory array operation in accordance with examples of the present disclosure.
Figure 3:
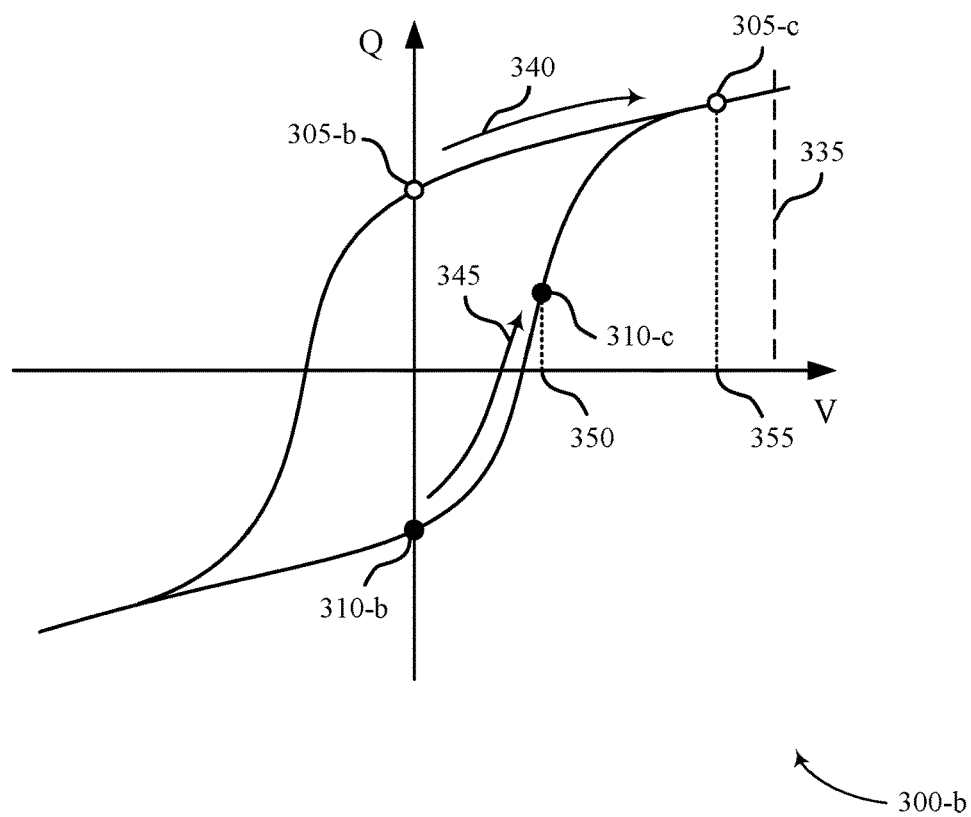

FIG. 3 illustrates an example of non-linear electrical properties with hysteresis curves 300-a and 300-b for a ferroelectric memory cell that is operated in accordance with various examples of the present disclosure. Hysteresis curves 300-a and 300-b illustrate an example ferroelectric memory cell writing and reading process, respectively. Hysteresis curves 300-a and 300-b depict the charge, Q, stored on a ferroelectric capacitor (e.g., capacitor 205 of FIG. 2) as a function of a voltage difference, V.

A ferroelectric material is characterized by a spontaneous electric polarization, i.e., it maintains a non-zero electric polarization in the absence of an electric field. Example ferroelectric materials include barium titanate (BaTiO3), lead titanate (PbTiO3), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300-a and 300-b may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300-a and 300-b represent a voltage difference across the capacitor and are directional. For example, a positive voltage may be realized by applying a positive voltage to the terminal in question (e.g., a cell plate 230) and maintaining the second terminal (e.g., a cell bottom 215) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300-a and 300-b.

As depicted in hysteresis curve 300-a, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1. In some examples, the logic values of the respective charge states may be reversed to accommodate other schemes for operating a memory cell.

A logic "0" or "1" may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing voltage 315, charge state 305-a follows path 320 until it reaches charge state 305 at zero voltage. Similarly, charge state 310 is written by applying a net negative voltage 325, which results in charge state 310-a. After removing negative voltage 325, charge state 310-a follows path 330 until it reaches charge state 310 at zero voltage. Charge states 305-a and 310-a may also be referred to as the remnant polarization (Pr) values, i.e., the polarization (or charge) that remains upon removing the external bias (e.g., voltage). The coercive voltage is the voltage at which the charge (or polarization) is zero.

Additionally or alternatively, for example, a logic "0" or "1" may be written to a memory cell by first applying a voltage to a plate line (e.g., plate line 210 as described with reference to FIG. 2) and a first access line that are each coupled with a first memory cell (e.g., memory cell 105-a as described with reference to FIG. 2). In some examples, the applied voltage may be referred to as a first voltage. A second memory cell (not shown) may subsequently be selected by applying a second voltage to a second access line (e.g., a word line) coupled with the second memory cell. In some examples, the second voltage may be applied after the first voltage. To access (e.g., to write a logic "0" or "1") the second memory cell, the second voltage may be reduced to a third voltage. In some examples, the second voltage may be removed and a third voltage may be subsequently applied. In other examples, the voltage (e.g., the second voltage) may be applied by a voltage source and may be reduced to a third voltage by activating one or more switching components. In some examples, the second voltage may be reduced—e.g., by floating or grounding one or more nodes of the second access line. In some examples, the third voltage may be a lower voltage than the second voltage. The second voltage may be removed from the second access line after accessing the second memory cell.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 305-b or 310-b was initially stored. For example, hysteresis curve 300-b illustrates two possible stored charge states 305-b and 310-b. Voltage 335 may be applied across the capacitor as discussed with reference to FIG. 2. In other cases, a fixed voltage may be applied to the cell plate and, although depicted as a positive voltage, voltage 335 may be negative. In response to voltage 335, charge state 305-b may follow path 340. Likewise, if charge state 310-b was initially stored, then it follows path 345. The final position of charge state 305-c and charge state 310-c depend on a number of factors, including the specific sensing scheme and circuitry.

Similar to the write operation described above, for example, the stored state of a memory cell may be ready by first applying a voltage to a plate line (e.g., plate line 210 as described with reference to FIG. 2) and a first access line (e.g., digit line 115-a as described with reference to FIG. 2) that are each coupled with a first memory cell (e.g., memory cell 105-a as described with reference to FIG. 2). In some examples, the applied voltage may be referred to as a first voltage. A second memory (not shown) cell may subsequently be selected by applying a second voltage to a second access line (e.g., a word line) coupled with the second memory cell. In some examples, the second voltage may be applied after the first voltage. To access (e.g., to read the stored state) the second memory cell, the second voltage may be reduced to a third voltage. In some examples, the third voltage may be a lower voltage than the second voltage. The second voltage may be removed from the second access line after accessing the second memory cell.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. So a voltage measured at a sense component may not equal voltage 335 and instead may depend on the voltage of the digit line. The position of final charge states 305-c and 310-c on hysteresis curve 300-b may thus depend on the capacitance of the digit line and may be determined through a load-line analysis—i.e., charge states 305-c and 310-c may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355—i.e., (voltage 335—voltage 350) or (voltage 335—voltage 355). A reference voltage may be generated such that its magnitude is between the two possible voltages of the two possible digit line voltages in order to determine the stored logic state—i.e., if the digit line voltage is higher or lower than the reference voltage. For example, the reference voltage may be an average of the two quantities, (voltage 335—voltage 350) and (voltage 335—voltage 355). Upon comparison by the sense component, the sensed digit line voltage may be determined to be higher or lower than the reference voltage, and the stored logic value of the ferroelectric memory cell (i.e., a logic 0 or 1) may be determined.

As discussed above, reading a memory cell that does not use a ferroelectric capacitor may degrade or destroy the stored logic state. A ferroelectric memory cell, however, may maintain the initial logic state after a read operation. For example, if charge state 305-*b* is stored, the charge state may follow path 340 to charge state 305-*c* during a read operation and, after removing voltage 335, the charge state may return to initial charge state 305-*b* by following path 340 in the opposite direction.

Hysteresis curve 300-*b* illustrates an example of reading of stored charge states 305 *a* and 310-*a*. A read voltage 335 may be applied, for example, as a voltage difference via a digit line 115-*a* and a plate line 210 as described with reference to FIG. 2. Hysteresis curve 300-*b* may illustrate read operations where the read voltage 335 is negative voltage difference Vcap (e.g., where Vbottom−Vplate is negative). A negative read voltage across the capacitor may be referred to as a "plate high" read operation, where a plate line 210 is taken initially to a high voltage, and a digit line 115-*a* is initially at a low voltage (e.g., a ground voltage). Although read voltage 335 is shown as a negative voltage across the ferroelectric capacitor 205, in alternative operations a read voltage may be a positive voltage across the ferroelectric capacitor 205, which may be referred to as a "plate low" read operation.

The read voltage 335 may be applied across the ferroelectric capacitor 205 when a memory cell 105 is selected (e.g., by activating a selection component 250 as described with reference to FIG. 2). Upon applying the read voltage 335 to the ferroelectric capacitor 205, charge may flow into or out of the ferroelectric capacitor 205 via the digit line 115-*a* and plate line 210, and different charge states may result depending on whether the ferroelectric capacitor 205 was at charge state 305-*a* (e.g., a logic 1) or at charge state 310-*a* (e.g., a logic 0).

When performing a read operation on a ferroelectric capacitor 205 at the charge state 305-*b* (e.g., a logic 0), additional negative charge may accumulate across the ferroelectric capacitor 205, and the charge state may follow path 340 until reaching the charge and voltage of charge state 310-*c*. The amount of charge flowing through the capacitor 205 may be related to the intrinsic capacitance of the digit line 115-*a* (e.g., intrinsic capacitance 260 described with reference to FIG. 2). Accordingly, as shown by the transition between charge state 310-*a* and charge state 310-*c*, the resulting voltage difference 350 may be a relatively large negative value due to the relatively large change in voltage for the given change in charge. Thus, upon reading a logic 0 in a "plate high" read operation, the digit line voltage, equal to the sum of VPL and the value of (Vbottom−Vplate) at charge state 310-*c*, may be a relatively low voltage. Such a read operation may not change the remnant polarization of the ferroelectric capacitor 205 that stored charge state 310-*a*, and thus after performing the read operation the ferroelectric capacitor 205 may return to charge state 310-*a* via path 340 when the read voltage 335 is removed (e.g., by applying a zero net voltage across the ferroelectric capacitor 205). Thus, performing a read operation with a negative read voltage on a ferroelectric capacitor 205 with a charge state 305-*a* may be considered a non-destructive read process.

When performing the read operation on the ferroelectric capacitor 205 at the charge state 310-*b* (e.g., a logic 1), the stored charge may reverse polarity as a net negative charge accumulates across the ferroelectric capacitor 205, and the charge state may follow path 360 until reaching the charge and voltage of charge state 305-*c*. The amount of charge flowing through the capacitor 205 may again be related to the intrinsic capacitance of the digit line 115-*a* (e.g., intrinsic capacitance 260 described with reference to FIG. 2). Accordingly, as shown by the transition between charge state 305-*a* and charge state 305-*c*, the resulting voltage difference 355 may be a relatively small negative value due to the relatively small change in voltage for the given change in charge. Thus, upon reading a logic 1 in a "plate high" read operation, the digit line voltage, equal to the sum of VPL and the value of (Vbottom−Vplate) at charge state 310-*c*, may be a relatively high voltage.

Similar to the read option described above with reference to hysteresis curve 300-*a*, the charge states 305-*b* and 310-*b* may be read during an access operation. For example, a voltage may be first applied to a plate line (e.g., plate line 210 as described with reference to FIG. 2) and a first access line that are each coupled with a first memory cell (e.g., memory cell 105-*a* as described with reference to FIG. 2). In some examples, the applied voltage may be referred to as a first voltage. A second memory cell may subsequently be selected by applying a second voltage to a second access line coupled with the second memory cell. In some examples, the second voltage may be applied after the first voltage. To access (e.g., to read the stored state) the second memory cell, the second voltage may be reduced to a third voltage. In some examples, the third voltage may be a lower voltage than the second voltage. The second voltage may be removed from the second access line after accessing the second memory cell.

Figure 4:
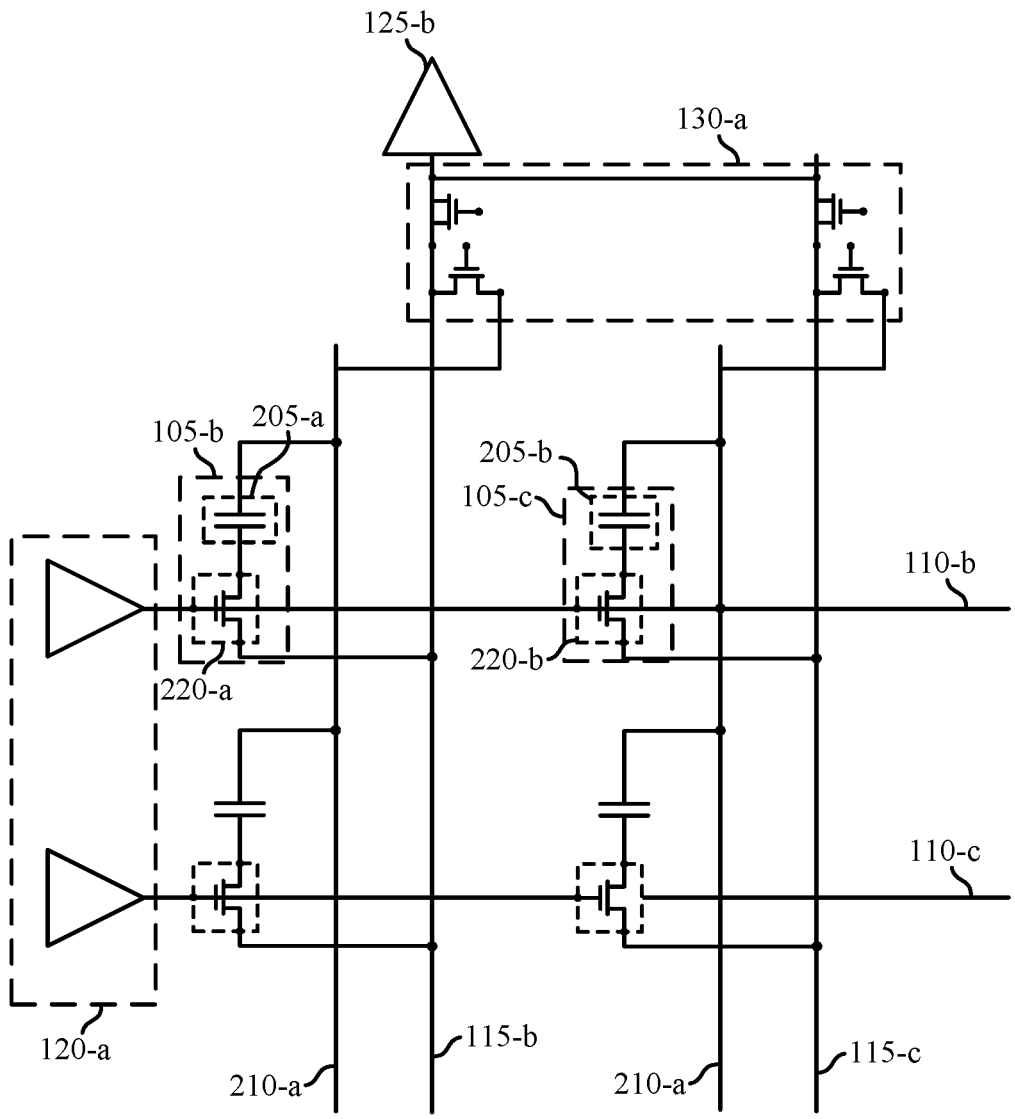
FIG. 4 illustrates an example memory array that supports a single plate configuration and memory array operation in accordance with examples of the present disclosure.

FIG. 4 illustrates an example memory array 400 that supports a single plate configuration and memory array operation in accordance with various examples of the present disclosure. Memory array 400 may be an example of memory array 100 as described with reference to FIG. 1. Memory array 400 may include memory cells 105-*b* and 105-*c*, word lines 110-*b* and 110-*c*, and digit lines 115-*b* and 115-*c*. Memory cells 105-*b* and 105-*c* may be examples of memory cell 105 as described with reference to FIG. 1, word lines 110-*b* and 110-*c* may be examples of word line 110 as described with reference to FIG. 1, and digit lines 115-*b* and 115-*c* may be examples of digit line 115 as described with reference to FIG. 1. In other examples, memory array 400 may include row decoder 120-*a*, sense component 125-*b*, and column decoder 130-*a*, which may be examples of row decoder 120, sense component 125, and column decoder 130, respectively, as described with reference to FIG. 1. Additionally or alternatively, for example, memory array 400 may include selection components 220-*a* and 220-*b* and plate line 210-*a*, which may be examples of selection component 220 and plate line 210, respectively, as described with reference to FIG. 2. In some examples, memory cell 105-*b* may include selection component 220-*a* and capacitor 205-*a*, which may be examples of selection component 220 and capacitor 205, respectively, as described with reference to FIG. 2. In some examples, memory cell 105-*c* may include selection component 220-*b* and capacitor 205-*b*, which may be examples of selection component 220 and capacitor 205, respectively, as described with reference to FIG. 2.

Memory array 400 may be referred to as an array of ferroelectric memory cells and may include memory cells 105-*b* and 105-*c* (as well as other memory cells not shown). In some examples, memory cell 105-*c* may be referred to as a first ferroelectric memory cell and memory cell 105-*b* may be referred to as a second ferroelectric memory cell, though these cells are not otherwise limited to this type of memory cell. As depicted in FIG. 4, each of first ferroelectric memory cell 105-*c* and second ferroelectric memory cell 105-*b* may be different memory cells. In some examples, plate line 210-*a* may be coupled with each of first ferroelectric memory cell 105-*c* and second ferroelectric memory cell 105-*b*.

Each of first ferroelectric memory cell 105-*c* and second ferroelectric memory cell 105-*b* may be coupled with digit lines 115-*c* and 115-*b*, respectively. Additionally or alternatively, for example, each of first memory cell 105-*c* and second memory cell 105-*b* may be coupled with word line 110-*b*. In some examples, the digit line 115-*c* may be referred to as a first access line. In some examples, the word line 110-*b* may be referred to as a second access line. As depicted in FIG. 4, each of first access line 115-*c* and second access line 110-*b* may be different access lines.

In some examples, the second access line 110-*b* may be coupled with each of memory cells 105-*b* and 105-*c*. For example, second access line 110-*b* may be coupled with a plurality of memory cells, and each memory cell may be coupled with a different digit line. Additionally or alternatively, for example, first access line 115-*c* may also be coupled with a plurality of memory cells, and each memory cell may be coupled with a different word line. In some examples, a memory cell coupled with access line 110-*b* may share a digit line (e.g., digit line 115-*b*) with one or more additional memory cells.

Memory array 400 may be configured for an access operation of a memory cell by first applying a voltage to the plate line 210-*a* and the first access line 115-*c*. In some examples, the voltage applied to the plate line 210-*a* and the first access line 115-*c* may be a same, fixed voltage, and each of the plate line 210-*a* and the first access line 115-*c* may be coupled with first memory cell 105-*c*. In some examples, the first voltage may be zero volts (0V). Stated alternatively, the first access line 115-*c* and the plate line 210-*a* may be grounded. Because the first access line 115-*c* may be in communication with digit line 115-*b* through column decoder 130-*a*, the column decoder 130-*a* may prevent the first applied voltage from reaching digit line 115-*b*. For example, the column decoder 130-*a* may contain one or more transistors that, when activated, may isolate the first voltage from the digit line 115-*b*. Thus, despite the digit line 115-*b* and the first access line 115-*c* being in communication, the first voltage may be applied only to the plate line 210-*a* and the first access line 115-*c*.

In other examples, a different, unrelated, voltage may be applied to the digit line 115-*b*. This voltage may be a positive voltage or a negative voltage and, as discussed above, the digit line 115-*b* may be isolated from the first access line 115-*c* by one or more transistors of the column decoder 130-*a* being activated. In further examples, memory array 400 may be coupled with a memory controller (e.g., memory controller 140 as described with reference to FIG. 1) and a first voltage source (not shown). For example, the memory controller may send an indication to apply the first voltage to the plate line 210-*a* and the first access line 115-*c*. In some examples, the memory controller may send an indication to a switching component (not shown) coupled with the first voltage source. Application of the first voltage may, for example, allow for an unselected access line (e.g., word line 110-*c*) to be operated at a negative voltage. In other examples, memory cell 105-*c* may be referred to as an unselected memory cell due to access line 115-*c* being operated at 0V (e.g., grounded). Additionally or alternatively, for example, memory cell 105-*b* may be referred to as a selected memory cell upon the application of a voltage (e.g., a second voltage greater than or less than 0V) to the second access line 110-*b*.

Memory cell 105-*b* may be selected by applying a second voltage to the second access line 110-*b* at a time different from applying the first voltage (e.g., after applying the first voltage). In other examples, the second voltage may be applied before the first voltage or concurrent with the first voltage. In some examples, memory cell 105-*b* may be coupled with the second access line 110-*b*, and the second access line 110-*b* may be operated at a different voltage than the plate line 210-*a*. In other examples, the plate line 210-*a* may be grounded and the first access line 115-*c* may be shorted with the plate line 210-*a*. As described above, memory array 400 may be coupled with a memory controller and, in some examples, may be coupled with a second voltage source (not shown). In some examples, the memory controller may send an indication to apply the second voltage to the second access line 110-*b*. In some examples, the memory controller may send an indication to a switching component (not shown) coupled with the second voltage source. Application of the second voltage may, for example, allow for operation of a selected access line (e.g., word line 110-*b*) at a positive voltage concurrent with an unselected access line (e.g., word line 110-*c*) operated at a negative voltage.

Memory cell 105-*b* may, in some examples, be accessed by reducing the second voltage applied to the second access line 110-*b* from a second voltage to a third voltage. In some examples, the third voltage may be a lower voltage than the second voltage. Additionally or alternatively, for example, the second voltage may be removed after accessing memory cell 105-*b*. In some examples, memory array may be coupled with a memory controller, as described above, and a third voltage source. They memory controller may, for example, send an indication to apply the third voltage to the second access line 110-*b*. In some examples, the memory controller may send an indication to a switching component (not shown) coupled with the third voltage source. In other examples, the memory controller may send an indication to merely reduce the applied second voltage to a third voltage. In either example, reducing the second voltage to a third voltage may preserve one or more materials (e.g., silicon oxide) of the accessed memory cell from degradation.

In some examples, the second access line may be maintained at a fixed voltage prior to selecting memory cell 105-*b*. In some examples, when the second voltage is removed from the second access line 110-*b*, the voltage of the second access line 110-*b* may return to a same voltage as the maintained, fixed voltage. For example, the second access line 110-*b* may be maintained at a negative one-point-seven volts (1.7V). The applied second voltage may increase the second access line 110-*b* to a positive three volts (3V). When the second voltage is removed, for example, the second access line 110-*b* may return to a negative 1.7V. Additionally or alternatively, for example, a fourth voltage may be applied to the second access line 110-*b* in response to the removing the third voltage. This voltage may be a same voltage as the fixed voltage applied prior to selecting memory cell 105-*b*. In other examples, both the fourth voltage and the fixed voltage applied to selected memory cell 105-*b* may be a negative voltage. As described above, for example, memory array 400 may be coupled with a fourth voltage source and a memory controller may send an indication to apply the fourth voltage to the second access line 110-*b*.

When applying the respective voltage to access line 115-*c*, the voltage may be applied to selection component 220-*b*. In some examples, selection component 220-*b* may be or include one or more transistors. In other examples, selection component 220-*b* may be or may include one or more junction-less transistors. For example, selection component 220-*b* may be or may include a first junction-less transistor. In other examples, when applying the respective voltages to access line 110-*b*, the voltages may be applied to selection component 220-*a*. In some examples, selection component 220-*a* may be or may include one or more transistors. In other examples, selection component 220-*a* may be or may include one or more junction-less transistors. For example, selection component 220-*a* may be or may include a second junction-less transistor.

In some examples, memory array 400 may include a sense component 125-*b* that may be used for or during one or more access operations. For example, the sense component 125-*b* may be coupled with column decoder 130-*a*, which may be coupled with each of digit line 115-*b* and digit line 115-*c*. Stated alternatively, digit line 115-*b* and digit line 115-*c* may be coupled with each other through column decoder 130-*a*. The sense component 125-*b* may receive the voltage of digit line 115-*b* during an access operation, and may compare the voltage with a reference voltage. As described with reference to FIG. 1, for example, if digit line 115-*b* has a higher voltage than the reference line voltage value, then the sense component 125-*b* output may be driven to a voltage (e.g., a positive supply voltage). The sense component 125-*b* may then latch the output of the sense amplifier and/or the voltage of digit line 115-*b*, which may be used to determine the stored state in memory cell 105-*c*.

In other examples, memory array 400 may include multiple decks of memory cells (not shown). For example, memory array 400 may include a second deck of ferroelectric memory cells coupled with the array. In some examples, the second deck of ferroelectric memory cells may include a third ferroelectric memory cell and a fourth ferroelectric memory cell different than the third ferroelectric memory cell. Additionally or alternatively, the second deck of ferroelectric memory cells may include a second plate coupled with the third and fourth ferroelectric memory cells and a third access line coupled with the third ferroelectric memory cell and the plate.

In some examples, the third access line and the plate may be configured to operate at a second fixed voltage level. In other examples, the second deck of ferroelectric memory cells may include a fourth access line coupled with the fourth ferroelectric memory cell. The fourth access line may be a different access line than the third access line. Additionally or alternatively, for example, the fourth access line may be configured to operate at a voltage level different than the second, fixed voltage level. In some examples, the fourth ferroelectric memory cell may be accessed in a similar manner as memory cell 105-*b*. For example, a first voltage may be applied to both the plate and the third access line. The fourth ferroelectric memory cell may, for example, be selected by applying a second voltage to the fourth access line and subsequently reducing the voltage to access the memory cell. In some examples, the second voltage may be reduced to a third voltage, which may be lower than the second voltage. Additionally or alternatively, for example, the applied second voltage may be removed after accessing the fourth ferroelectric memory cell of the second deck.

Figure 5:
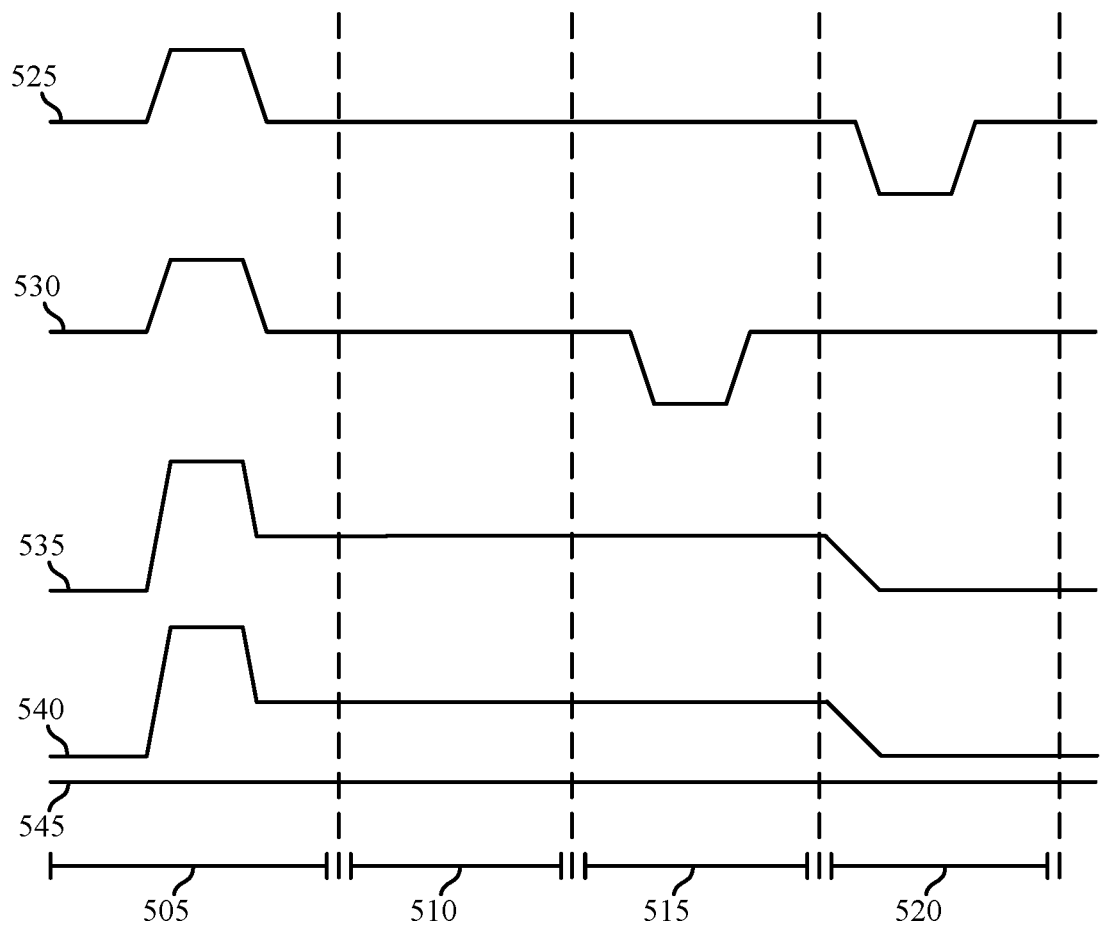
FIG. 5 illustrates an example timing diagram that supports a single plate configuration and memory array operation in accordance with examples of the present disclosure.

FIG. 5 illustrates an example of a timing diagram 500 that supports a single plate configuration and memory array operation in accordance with various examples of the present disclosure. Timing diagram includes voltage (V) along the vertical axis and time (t) along the horizontal axis; and timing diagram 500 may represent at least a portion of an access operation. The voltages of various components as a function of time are also represented on timing diagram 500. For example, timing diagram 500 includes first digit line voltage 525, second digit line voltage 530, selected word line voltage 535, digit line selector voltage 540, and plate line voltage 545. In some examples, digit line selector voltage 540 may relate to the operation of digit line 115-*b* as described with reference to FIG. 4. Thus, timing diagram 500 may correspond to operating memory array 400 as described with reference to FIG. 4, among other operations, and the following discussion is in the context of components depicted in FIG. 4.

As discussed above, a first voltage may be applied to a plate line (e.g., plate line 210-*a* as described with reference to FIG. 4) and a first access line (e.g., first access line 115-*c* as described with reference to FIG. 4) that are each coupled with a ferroelectric memory cell (e.g., first ferroelectric memory cell 105-*c* as described with reference to FIG. 4). In some examples, the first voltage may be zero volts (0V). Stated alternatively, in some examples, the first access line and the plate may each be grounded. For example, the first voltage may be applied to deselect a memory cell (e.g., memory cell 105-*c* as described with reference to FIG. 4) coupled with the first access line (e.g., first access line 115-*c* as described with reference to FIG. 4). As described above, the first voltage applied to the first access line may be isolated from digit line 115-*b*, for example, by activating one or more transistors of a column decoder (e.g., column decoder 130-*a* as described with reference to FIG. 4). In some examples, the first memory cell may be deselected by applying the first voltage to the plate line and to the first access line. Additionally or alternatively, for example, the first voltage may remain constant throughout the operation. Stated alternatively, the first voltage may be applied throughout the access operation.

In some examples, a second ferroelectric memory cell (e.g., second ferroelectric memory cell 105-*b* as described with reference to FIG. 4) may be selected by applying a second voltage to a second access line (e.g., second access line 110-*b* as described with reference to FIG. 4) coupled with the second ferroelectric memory cell. In some examples, the second voltage may be applied after the first voltage. In other examples, the second voltage may be applied before the first voltage, or concurrent with the first voltage. Applying the second voltage may, for example, allow a selected access line (e.g., second access line 110-*b* as described with reference to FIG. 4) to be operated at a positive voltage, while an unselected access line (e.g., word line 110-*c* as described with reference to FIG. 4) is operated at a negative voltage. Additionally or alternatively, for example, the second ferroelectric memory cell may be accessed by reducing the second voltage to a third voltage. In some examples, the third voltage may be a lower voltage than the second voltage. In some examples, this voltage reduction may preserve one or more materials of the memory cell from degradation. The second applied voltage may be removed after accessing the second ferroelectric memory cell.

At time interval 505 an activate command (ACT) may be issued by a memory controller (e.g., memory controller 140 as described with reference to FIG. 1). In some examples, an ACT command may include applying a first voltage to a plate line and to a first access line that are each coupled with a first ferroelectric memory cell. Additionally or alternatively, for example, a second ferroelectric memory cell may be selected by applying a second voltage to a second access line after applying the first voltage. In other examples, as described above, the second voltage may be applied before the first voltage, or concurrent with the first voltage.

The application of the second voltage may be depicted as an increased voltage in the selected word line voltage 535. Depending on the stored state (e.g., logic "1" or logic "0") of the selected memory cell, the voltage of the selected digit line may be depicted by first digit line voltage 525 or second digit line voltage 530. For example, if the selected memory cell includes a stored logic "1", the voltage of the of the corresponding digit line may be represented by first digit line voltage 525. If the selected memory cell includes a stored logic "0", the voltage of the corresponding digit line may be represented by second digit line voltage 530. In either example, first digit line voltage 525 and second digit line voltage 530 may each be increased to, for example positive one-and-one-half volts (1.5V).

In some examples, when a second voltage is applied to a second access line (e.g., second access line 110-b as described with reference to FIG. 4), the voltage of selected word line voltage 535 may increase to, for example, a positive three volts (3V). In other examples, digit line selector voltage may also increase to a positive 3V. In other examples, plate line voltage 545 may remain at a constant voltage for the duration of time interval 505. The plate line voltage may, for example, remain at zero volts (0V).

In other examples, at time interval 505, a read/write command (RD/WR) may be issued by a memory controller (e.g., memory controller 140, as described with reference to FIG. 1). In some examples a RD/WR command may commence accessing the selected ferroelectric memory cell by reducing the second voltage applied to the second access line to a third voltage. In some examples, the third voltage may be lower than the second voltage.

The reduction of the second voltage to a third voltage may be depicted as a decreased voltage in the selected word line voltage 535. In some examples, selected word line voltage 535 may be reduced from positive 3V to positive 1.5V. Depending on the stored state (e.g., logic "1" or logic "0") of the selected memory cell, the voltage of the selected digit line may be depicted by first digit line voltage 525 or second digit line voltage 530. In either example, first digit line voltage 525 and second digit line voltage 530 may each be reduced to, for example 0V. Additionally or alternatively, for example, during time interval 505, digit line selector voltage 540 may also decrease to a positive 1.5V. In some examples, plate line voltage 545 may remain at a constant voltage for the duration of time interval 510. The plate line voltage may, for example, remain at 0V.

At time interval 515 a write back operation and/or a precharge command (PCH) may be issued by a memory controller (e.g., memory controller 140 as described with reference to FIG. 1). The PCH command may, for example, result in first digit line voltage 525, selected word line voltage 535, and digit line selector voltage 540 each remaining at a constant voltage level. In some examples, each of first digit line voltage 525, selected word line voltage 535, and digit line selector voltage 540 may remain at a positive 1.5V. In other examples, second digit line voltage 530 may be further-reduced to, for example, a negative 1.5V. This reduction may allow for recovery of the corresponding memory cell (e.g., memory cell 105-b as described with reference to FIG. 4). Additionally or alternatively, for example, the plate line voltage 545 may remain at a constant voltage for the duration of time interval 515. In some examples, the plate line voltage may remain at 0V.

At time interval 520 a recovery pulse may be issued by a memory controller (e.g., memory controller 140 as described with reference to FIG. 1). In some examples, the application of a recovery pulse may represent applying a recovery pulse to the second access line after the removal of the applied second voltage and may occur in response to the discharging of a ferroelectric capacitor of the second ferroelectric memory (e.g., second ferroelectric memory cell 105-b as described with reference to FIG. 4).

The application of the second voltage may be depicted as a decreased voltage in the selected word line voltage 535. In some examples, the selected word line voltage may begin at a negative one-point-seven volts (1.7V). In some examples, the selected word line may be reduced to a same voltage as before the application of the second voltage. Depending on the stored state (e.g., logic "1" or logic "0") of the selected memory cell, the voltage of the selected digit line may be depicted by first digit line voltage 525 or second digit line voltage 530. For example, if the selected memory cell includes a stored logic "1", the voltage of the of the corresponding digit line may be represented by first digit line voltage 525. In some examples, the first digit line voltage may be reduced to, for example, a negative 1.5V, which may allow for recovery of the corresponding memory cell. In other examples, if the selected memory cell includes a stored logic "0", the voltage of the corresponding digit line may be represented by second digit line voltage 530. In either instance, the plate line voltage 545 may remain at a constant voltage for the duration of time interval 520. In some examples, the plate line voltage may remain at 0V.

Figure 6:
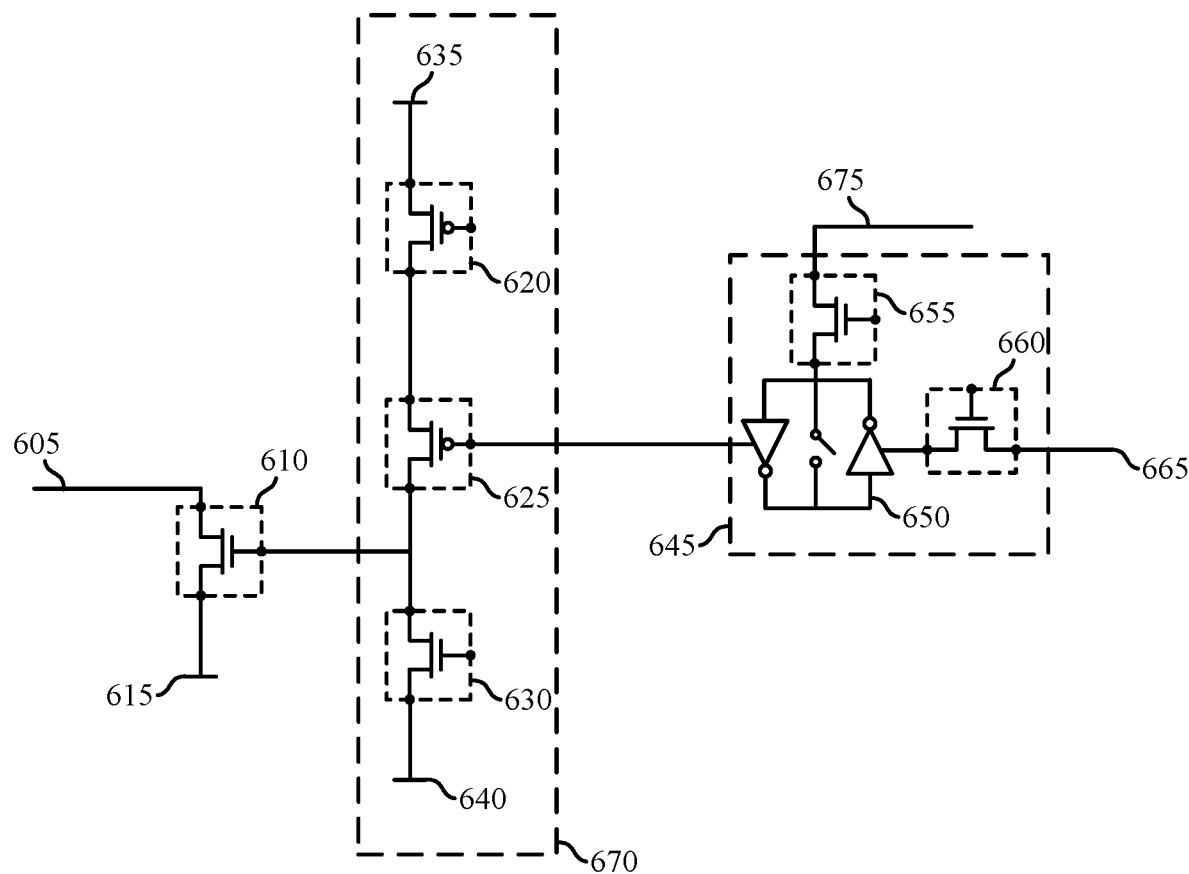
FIG. 6 illustrates an example circuit that supports a single plate configuration and memory array operation in accordance with examples of the present disclosure.

FIG. 6 illustrates an example of a circuit 600 that supports a single plate configuration and memory array operation in accordance with various examples of the present disclosure. Circuit 600 may be included in the operation of memory array 400 as described with reference to FIG. 4. In some examples, circuit 600 may include digit line 605, selection component 610, and voltage source 615. In some examples digit line 605 may be an example of digit line 115-a as described with reference to FIG. 2. In other examples, selection component 610 may be referred to as transistor 610 and voltage source 615 may be referred to as a negative voltage source 615.

In some examples, selection component 610 may be coupled with a precharge voltage selector 670. In some examples, precharge voltage selector 670 may include transistors 620, 625, and 630, which may be referred to as a plurality of transistors, and voltage sources 635 and 640. In some examples, voltage source 635 may be referred to as positive voltage source 635 and voltage source 640 may be referred to as negative voltage source 640. Additionally or alternatively, for example, one or more of transistors 620, 625, and 630 may be a PMOS transistor.

In other examples, precharge voltage selector 670 may be coupled with a sense amplifier 645. In some examples the sense amplifier 645 may include a latch 650, which may be referred to as VDD latch 650. The Latch 650 may be coupled with a transistor 655, which may be coupled with a capacitor (e.g., capacitor 205 as described with reference to FIG. 2) through line 675. In other examples, the latch 650 may be coupled with a transistor 660, which may be coupled with a reference line 665 (e.g., reference line 225 as described with reference to FIG. 2). In some examples, the sense amplifier 645 may be configured such that if the latch stores a logic "1", a discharge pulse may be generated. In other examples, the sense amplifier 645 may be configured such that latch stores a logic "0", a discharge pulse may not be generated.

In some examples, circuit 600 may be coupled with an one or more aspects of an array of ferroelectric memory cells (e.g., memory array 400 as described with reference to FIG.

4). The array may include a first ferroelectric memory cell (e.g., first ferroelectric memory cell 105-*b* as described with reference to FIG. 4) coupled with a first access line (e.g., first access line 115-*c* as described with reference to FIG. 4) and a second ferroelectric memory cell (e.g., second ferroelectric memory cell 105-*c* as described with reference to FIG. 4) coupled with a second access line (e.g., a second access line 110-*b* as described with reference to FIG. 4). In some examples, the memory array may include a plate (e.g., plate line 210-*a* as described with reference to FIG. 4) coupled with the first ferroelectric memory cell, the second ferroelectric memory cell, and the first access line.

Additionally or alternatively, for example, circuit 600 may be coupled with the second ferroelectric memory cell through the second access line. In some examples, circuit 600 may be referred to as a driver 600, and driver 600 may be coupled with the second ferroelectric memory cell through the second access line. In some examples, the precharge voltage selector 670 may be configured to apply a voltage to the second access line through transistor 610. The applied voltage may represent selecting a second ferroelectric memory cell by applying a second voltage to a second access line that is coupled with the second ferroelectric memory cell after applying a first voltage to the plate and the first access line coupled with the first ferroelectric memory cell.

Figure 7:
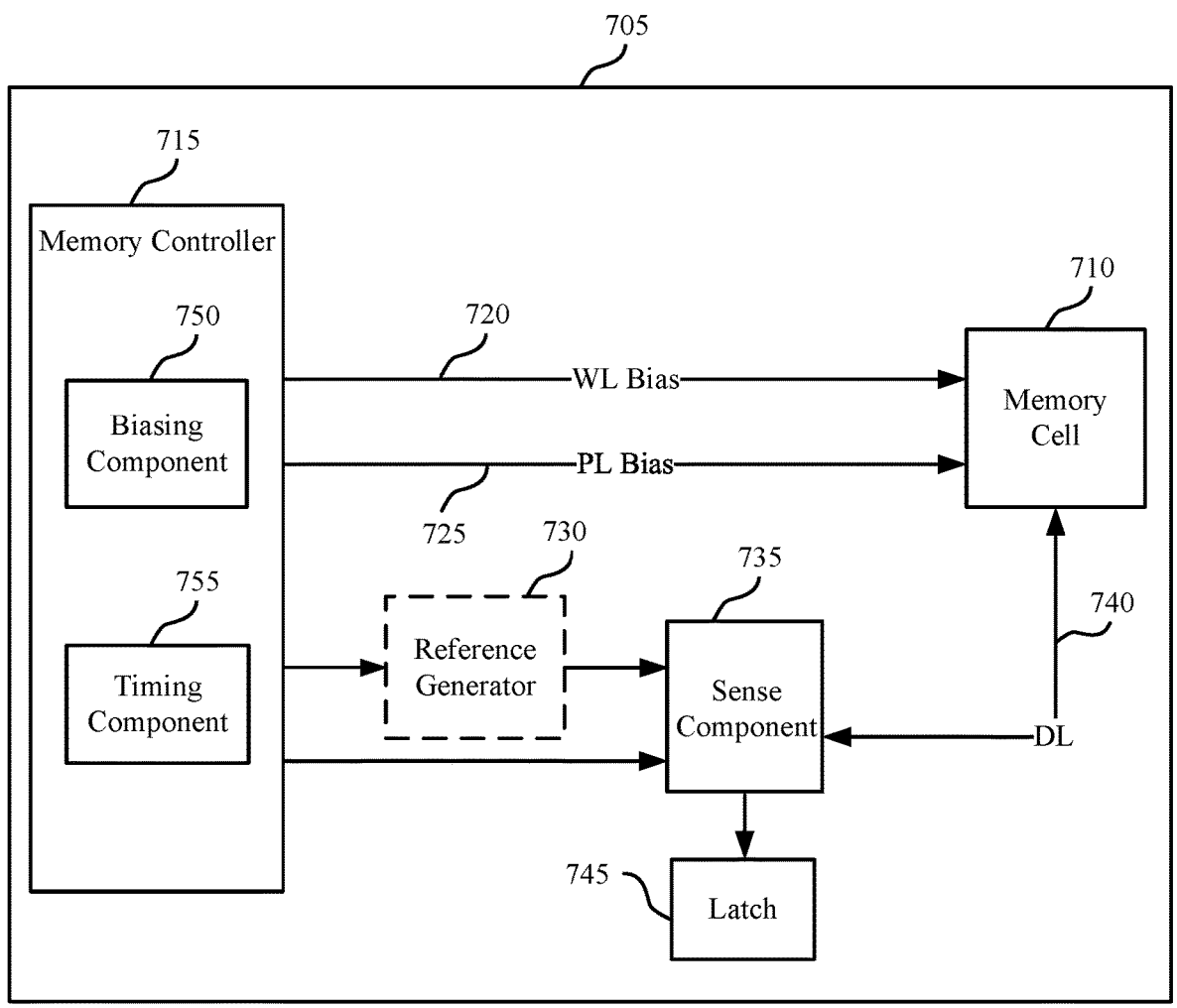
FIG. 7 illustrates an example memory device that supports a single plate configuration and memory array operation in accordance with examples of the present disclosure.

FIG. 7 illustrates a block diagram 700 of a memory array 705 that supports a single plate configuration and memory array operation in accordance with examples of the present disclosure. Memory array 705 may be referred to as an electronic memory apparatus, and may be an example of a component of a memory array (e.g., memory array 100 as described with reference to FIG. 1) as described herein.

Memory array 705 may include one or more memory cells 710, a memory controller 715, a word line 720, a plate line 725, a reference generator 730, a sense component 735, a digit line 740, and a latch 745. These components may be in electronic communication with each other and may perform one or more of the functions described herein. In some cases, memory controller 715 may include biasing component 750 and timing component 755. In some cases, sense component 735 may serve as the reference generator 730. In other cases, reference generator 730 may be optional.

Memory controller 715 may be in electronic communication with word line 720, digit line 740, sense component 735, and plate line 725, which may be examples of word line 110, digit line 115, sense component 125, and plate line 210 described with reference to FIG. 1, and 2. Memory array 705 may also include reference generator 730 and latch 745. The components of memory array 705 may be in electronic communication with each other and may perform aspects of the functions described with reference to FIGS. 1 through 6. In some cases, reference generator 730, sense component 735, and latch 745 may be components of memory controller 715.

In some examples, digit line 740 is in electronic communication with sense component 735 and a ferroelectric capacitor of ferroelectric memory cells 710. A ferroelectric memory cell 710 may be writable with a logic state (e.g., a first or second logic state). Word line 720 may be in electronic communication with memory controller 715 and a selection component of ferroelectric memory cell 710. Plate line 725 may be in electronic communication with memory controller 715 and a plate of the ferroelectric capacitor of ferroelectric memory cell 710. Sense component 735 may be in electronic communication with memory controller 715, digit line 740, latch 745, and reference line 760. reference generator 730 may be in electronic communication with memory controller 715 and reference line 760. Sense control line 765 may be in electronic communication with sense component 735 and memory controller 715. These components may also be in electronic communication with other components, both inside and outside of memory array 705, in addition to components not listed above, via other components, connections, or buses.

Memory controller 715 may be configured to activate word line 720, plate line 725, or digit line 740 by applying voltages to those various nodes. For example, biasing component 750 may be configured to apply a voltage to operate memory cell 710 to read or write memory cell 710 as described above. In some cases, memory controller 715 may include a row decoder, column decoder, or both, as described herein. This may enable memory controller 715 to access one or more memory cells 105. Biasing component 750 may also provide voltage to reference generator 730 in order to generate a reference signal for sense component 735. Additionally, biasing component 750 may provide voltage for the operation of sense component 735.

In some cases, memory controller 715 may perform its operations using timing component 755. For example, timing component 755 may control the timing of the various word line selections or plate biasing, including timing for switching and voltage application to perform the memory functions, such as reading and writing, discussed herein. In some cases, timing component 755 may control the operations of biasing component 750.

Reference generator 730 may include various components to generate a reference signal for sense component 735. Reference generator 730 may include circuitry configured to produce a reference signal. In some cases, reference generator 730 may be implemented using other ferroelectric memory cells 105. Sense component 735 may compare a signal from memory cell 710 (through digit line 740) with a reference signal from reference generator 730. Upon determining the logic state, the sense component may then store the output in latch 745, where it may be used in accordance with the operations of an electronic device that memory array 705 is a part. Sense component 735 may include a sense amplifier in electronic communication with the latch and the ferroelectric memory cell.

Memory controller 715 and/or at least some of its various sub-components may be implemented in hardware, software executed by a processor, firmware, or any combination thereof. If implemented in software executed by a processor, the functions of the memory controller 715 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The memory controller 715 and/or at least some of its various sub-components may be physically located at various positions, including being distributed such that portions of functions are implemented at different physical locations by one or more physical devices. In some examples, memory controller 715 and/or at least some of its various sub-components may be a separate and distinct component in accordance with various examples of the present disclosure. In other examples, memory controller 715 and/or at least some of its various sub-components may be combined with one or more other hardware components, including but not limited to an I/O component, a transceiver, a network server, another computing device, one or more other components described in the present disclosure, or a combination thereof in accordance with various examples of the present disclosure.

Memory controller 715 may apply a first voltage to a plate line and a first access line that are each coupled with a first ferroelectric memory cell. In some examples, memory controller 715 may select a second ferroelectric memory cell by applying a second voltage to a second access line that is coupled with the second ferroelectric memory cell after applying the first voltage. In other examples, memory controller 715 may access the second ferroelectric memory cell by reducing the second voltage applied to the second access line to a third voltage lower than the second voltage. Additionally or alternatively, for example, memory controller 715 may remove the applied second voltage after accessing the selected ferroelectric memory cell of. The memory controller 715 may also apply a second voltage to the second access line to select a second ferroelectric memory cell. In some examples, memory controller 715 may reduce the second voltage to a third voltage to access the second ferroelectric memory cell, and remove the applied second voltage after accessing the second ferroelectric memory cell. In some cases, a memory controller 715 may be coupled with at least one memory cell of the array and may be operable to apply a first voltage to the plate line and the first access line.

Figure 8:
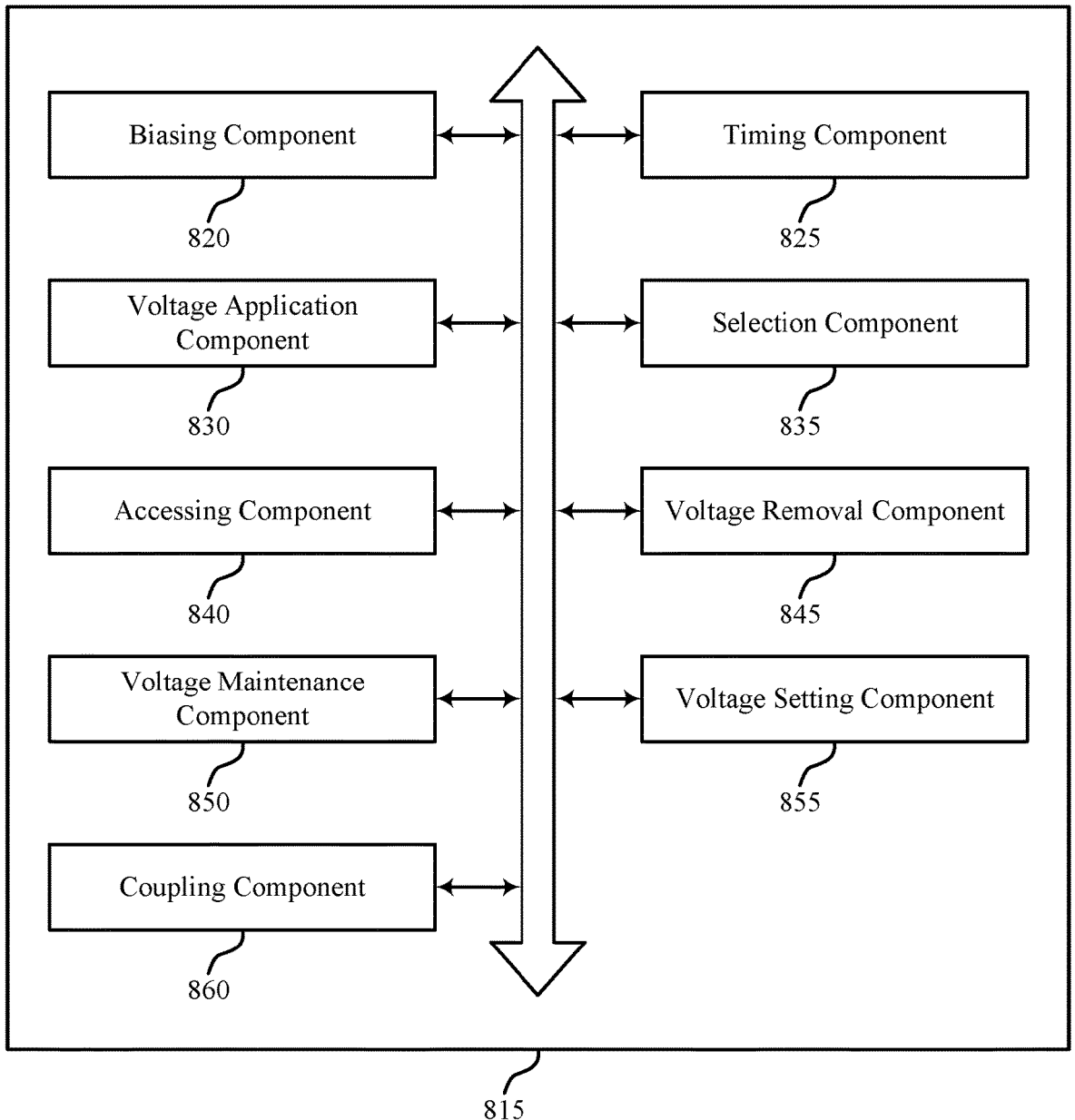
FIG. 8 illustrates an example memory device that supports a single plate configuration and memory array operation in accordance with examples of the present disclosure.

FIG. 8 shows a block diagram 800 of a memory controller 815 that supports a single plate configuration and memory array operation in accordance with examples of the present disclosure. The memory controller 815 may be an example of aspects of a memory controller 915 described with reference to FIG. 1. The memory controller 815 may include biasing component 820, timing component 825, voltage application component 830, selection component 835, accessing component 840, voltage removal component 845, voltage maintenance component 850, voltage setting component 855, and coupling component 860. Each of these modules may communicate, directly or indirectly, with one another (e.g., via one or more buses).

Voltage application component 830 may apply a first voltage to a plate line and a first access line that are each coupled with a first ferroelectric memory cell. In some examples voltage application component 830 may apply a recovery pulse to the second access line after the removal of the applied second voltage. In some examples, the discharging of the ferroelectric capacitor of the second ferroelectric memory cell may be based on the application of the recovery pulse. In other examples, voltage application component 830 may apply the first voltage to the plate line and the first access line that are each coupled with the first ferroelectric memory cell of a first deck of ferroelectric memory cells.

Selection component 835 may select a second ferroelectric memory cell by applying a second voltage to a second access line that is coupled with the second ferroelectric memory cell. In some examples, selection component 835 may select a second ferroelectric memory cell after applying the first voltage. In other examples, selection component 835 may select the second ferroelectric memory cell of a second deck of ferroelectric memory cells by applying the second voltage to the second access line that is coupled with the second deck of ferroelectric memory cells. In some examples, selection component 835 may select the second ferroelectric memory cell of the second deck of ferroelectric memory cells after applying the first voltage.

Accessing component 840 may access the second ferroelectric memory cell by reducing the second voltage applied to the second access line to a third voltage lower than the second voltage. In other examples, accessing component 840 may access the second ferroelectric memory cell of the second deck of ferroelectric memory cells by reducing the second voltage applied to the second access line to the third voltage lower than the second voltage.

Voltage removal component 845 may remove the applied second voltage after accessing the selected second ferroelectric memory cell. In other examples, voltage removal component 845 may remove the applied second voltage after accessing the selected second ferroelectric memory cell of the second deck of ferroelectric memory cells. In some cases, the removal of the applied second voltage may include discharging a ferroelectric capacitor of the second ferroelectric memory cell.

Voltage maintenance component 850 may maintain the second access line at a fixed voltage prior to selecting the second ferroelectric memory. In other examples, voltage maintenance component 850 may maintain the application of the first voltage to the plate line and the first access line until the removal of the applied second voltage.

Voltage setting component 855 may set a fourth voltage across the second access line in response to the removal of the applied second voltage. In some examples, the fourth voltage may be the same as the fixed voltage Coupling component 860 may couple the plate line with each of the first ferroelectric memory cell, the second ferroelectric memory cell, and the first access line. In other examples, coupling component 860 may couple the plate line with each of the first deck of ferroelectric memory cells, the second deck of ferroelectric memory cells, and the first access line.

In other examples, memory controller 815 may reduce the second voltage to a third voltage to access the ferroelectric memory cell of the second deck. In some examples, memory controller 815 may remove the applied second voltage after accessing the ferroelectric memory cell. Additionally or alternatively, for example, memory controller 815 may apply a second voltage to the second access line to select a second ferroelectric memory cell.

In some cases, memory controller 815 may operate the first ferroelectric memory cell and the plate at a same fixed voltage level. In other cases, memory controller 815 may operate the second access line at a voltage level different than the same fixed voltage level. In some examples, memory controller 815 may operate a set of plates coupled with each of the ferroelectric memory cells at a fixed voltage level.

In some cases, memory controller 815 may operate the second access line at a same voltage as the plate. In some examples, memory controller 815 may apply a first voltage to the plate line and the first access line. Additionally or alternatively, for example, memory controller 815 may apply a recovery pulse after the removal of the applied second voltage to discharge a ferroelectric capacitor of the second ferroelectric memory cell. In some cases, memory controller 815 may apply the first voltage to the plate line and the first access line until the removal of the applied second voltage. In some examples, memory controller 815 may apply a voltage to the second access line through the first transistor and a precharge voltage selector.

Figure 9:
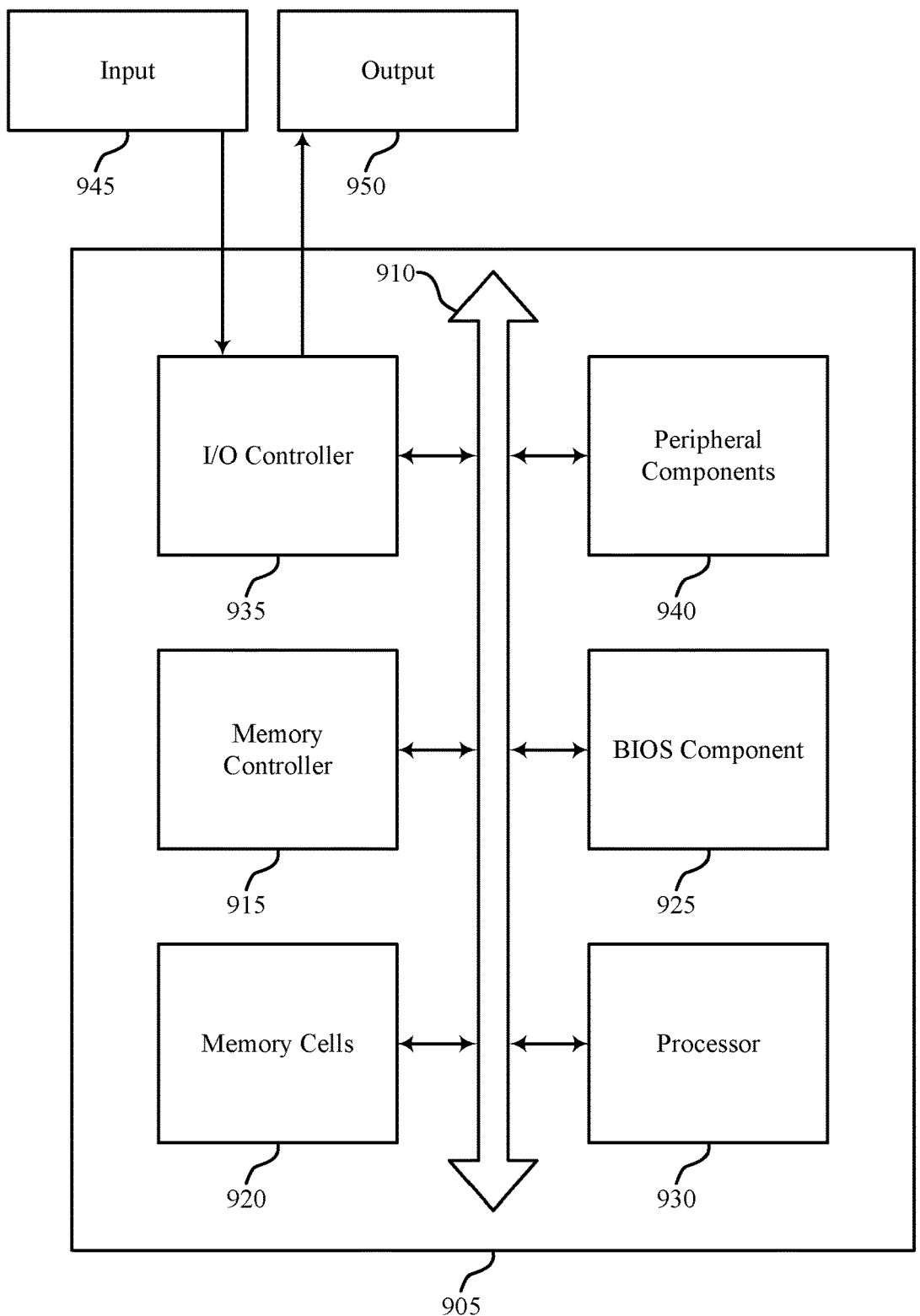
FIG. 9 illustrates an example memory device, including a memory array, that supports a single plate configuration and memory array operation in accordance with examples of the present disclosure.

FIG. 9 shows a diagram of a system 900 including a device 905 that supports a single plate configuration and memory array operation in accordance with examples of the present disclosure. Device 905 may be an example of or include the components of a memory array (e.g., memory array 100 as described with reference to FIG. 1) as described above. Device 905 may include components for bi-directional voice and data communications including components for transmitting and receiving communications, including memory controller 915, memory cells 920, basic input/output system (BIOS) component 925, processor 930, I/O controller 935, and peripheral components 940. These components may be in electronic communication via one or more buses (e.g., bus 910).

Memory controller 915 may operate one or more memory cells as described herein. Specifically, memory controller 915 may be configured to support a single plate configuration and memory array operation. In some cases, memory controller 915 may include a row decoder, column decoder, or both, as described herein (not shown).

Memory cells 920 may store information (i.e., in the form of a logical state) as described herein. BIOS component 925 be a software component that includes BIOS operated as firmware, which may initialize and run various hardware components. BIOS component 925 may also manage data flow between a processor and various other components, e.g., peripheral components, input/output control component, etc. BIOS component 925 may include a program or software stored in read only memory (ROM), flash memory, or any other non-volatile memory.

Processor 930 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 930 may be configured to operate a memory array using a memory controller. In other cases, a memory controller may be integrated into processor 930. Processor 930 may be configured to execute computer-readable instructions stored in a memory to perform various functions (e.g., functions or tasks supporting a single plate configuration and memory array operation).

I/O controller 935 may manage input and output signals for device 905. I/O controller 935 may also manage peripherals not integrated into device 905. In some cases, I/O controller 935 may represent a physical connection or port to an external peripheral. In some cases, I/O controller 935 may utilize an operating system such as iOS®, ANDROID®, MS-DOS®, MS-WINDOWS®, OS/2®, UNIX®, LINUX®, or another known operating system. In other cases, I/O controller 935 may represent or interact with a modem, a keyboard, a mouse, a touchscreen, or a similar device. In some cases, I/O controller 935 may be implemented as part of a processor. In some cases, a user may interact with device 905 via I/O controller 935 or via hardware components controlled by I/O controller 935.

Peripheral components 940 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 945 may represent a device or signal external to device 905 that provides input to device 905 or its components. This may include a user interface or an interface with or between other devices. In some cases, input 945 may be managed by I/O controller 935, and may interact with device 905 via a peripheral component 940.

Output 950 may also represent a device or signal external to device 905 configured to receive output from device 905 or any of its components. Examples of output 950 may include a display, audio speakers, a printing device, another processor or printed circuit board, etc. In some cases, output 950 may be a peripheral element that interfaces with device 905 via peripheral component(s) 940. In some cases, output 950 may be managed by I/O controller 935.

The components of device 905 may include circuitry designed to carry out their functions. This may include various circuit elements, for example, conductive lines, transistors, capacitors, inductors, resistors, amplifiers, or other active or inactive elements, configured to carry out the functions described herein. Device 905 may be a computer, a server, a laptop computer, a notebook computer, a tablet computer, a mobile phone, a wearable electronic device, a personal electronic device, or the like. Or device 905 may be a portion or aspect of such a device.

Figure 10:
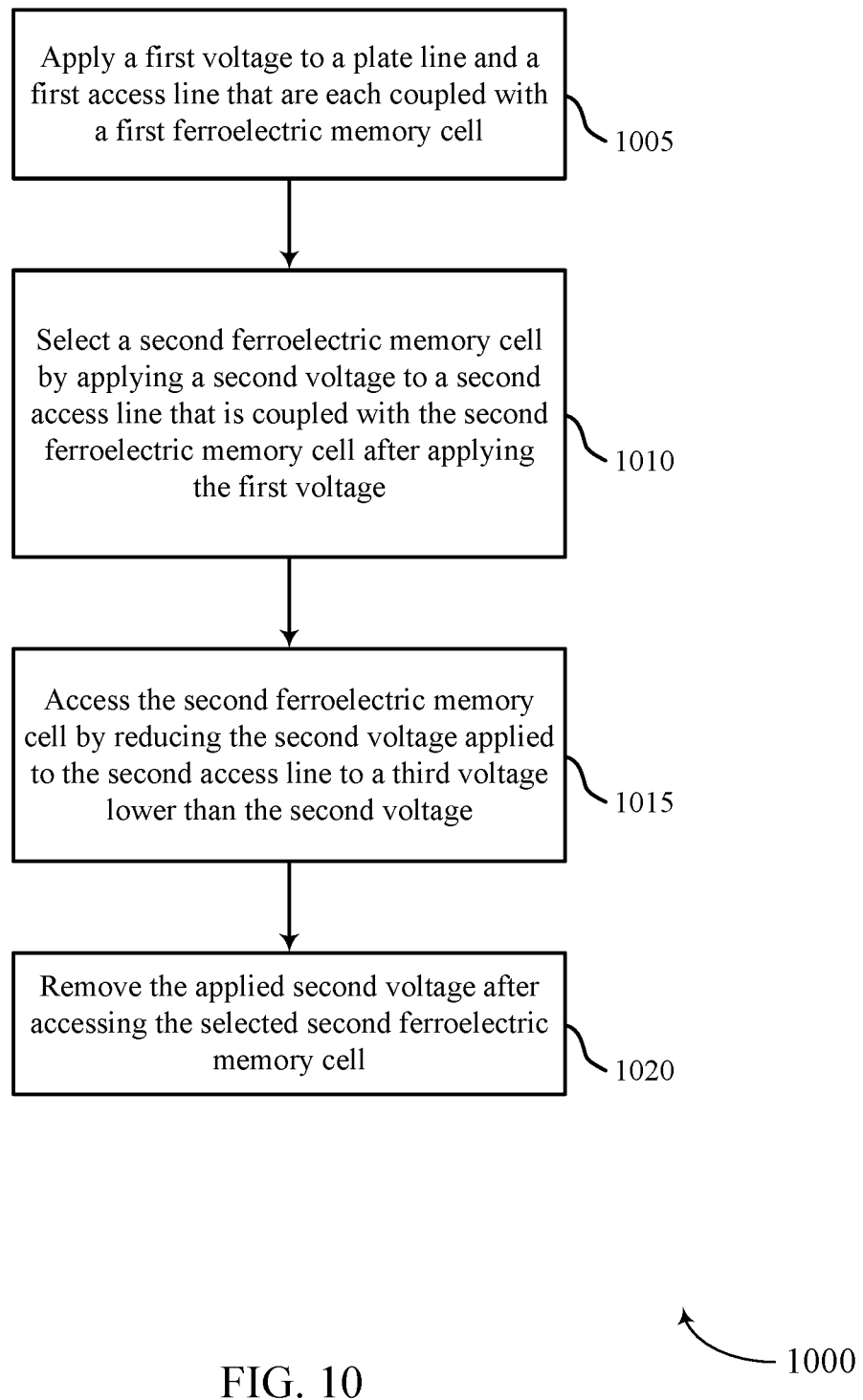
FIG. 10 is a flowchart that illustrates a method or methods that support a single plate configuration and memory array operation in accordance with examples of the present disclosure.

FIG. 10 is a flowchart illustrating a method 1000 for a single plate configuration and memory array operation in accordance with examples of the present disclosure. The operations of method 1000 may be implemented by a memory array (e.g., memory array 100 as described with reference to FIG. 1) or its components as described herein. For example, the operations of method 1000 may be performed by a memory controller (e.g., memory controller 815) as described with reference to FIGS. 6 through 9. In some examples, a memory array may execute a set of codes to control the functional elements of the device to perform the functions described below. Additionally or alternatively, the memory array may perform aspects of the functions described below using special-purpose hardware.

At block 1005 the memory array may apply a first voltage to a plate line and a first access line that are each coupled with a first ferroelectric memory cell. The operations of block 1005 may be performed according to the methods described herein. In certain examples, aspects of the operations of block 1005 may be performed by a voltage application component as described with reference to FIGS. 6 through 9.

At block 1010 the memory array may select a second ferroelectric memory cell by applying a second voltage to a second access line that is coupled with the second ferroelectric memory cell after applying the first voltage. The operations of block 1010 may be performed according to the methods described herein. In certain examples, aspects of the operations of block 1010 may be performed by a selection component as described with reference to FIGS. 6 through 9.

At block 1015 the memory array may access the second ferroelectric memory cell by reducing the second voltage applied to the second access line to a third voltage lower than the second voltage. The operations of block 1015 may be performed according to the methods described herein. In certain examples, aspects of the operations of block 1015 may be performed by a accessing component as described with reference to FIGS. 6 through 9.

At block 1020 the memory array may remove the applied second voltage after accessing the selected second ferroelectric memory cell. The operations of block 1020 may be performed according to the methods described herein. In certain examples, aspects of the operations of block 1020 may be performed by a voltage removal component as described with reference to FIGS. 6 through 9.

In some cases, the method may include applying a first voltage to a plate line and a first access line that are each coupled with a first ferroelectric memory cell. In other examples, the method may include removing the applied second voltage after accessing the selected second ferroelectric memory cell of the second deck of ferroelectric memory cells. Additionally or alternatively, for example, the method may include accessing the second ferroelectric memory cell by reducing the second voltage applied to the second access line to a third voltage lower than the second voltage. In some cases, the method may include removing the applied second voltage after accessing the selected second ferroelectric memory cell.

In some examples, the method may include maintaining the second access line at a fixed voltage prior to selecting the second ferroelectric memory cell. Additionally or alternatively, for example, the method may include maintaining the application of the first voltage to the plate line and the first access line until the removal of the applied second voltage. In some cases, the method may include setting a fourth voltage across the second access line in response to the removal of the applied second voltage. In some examples, the fourth voltage may be the same as the fixed voltage.

In some cases, the method may include selecting a second ferroelectric memory cell by applying a second voltage to a second access line coupled with the second ferroelectric memory. In some examples, the second voltage may be applied after applying the first voltage. In other examples, the removal of the applied second voltage may include discharging a ferroelectric capacitor of the second ferroelectric memory cell. In some examples, the method may include applying a recovery pulse to the second access line after the removal of the applied second voltage. In some examples, the discharging of the ferroelectric capacitor of the second ferroelectric memory cell may be based at least in part on the application of the recovery pulse. Additionally or alternatively, for example, the plate line may be coupled with each of the first ferroelectric memory cell, the second ferroelectric memory cell, and the first access line.

In other cases, the method may include applying the first voltage to the plate line and the first access line. In some examples, the plate line and the first access line may each be coupled with the first ferroelectric memory cell of a first deck of ferroelectric memory cells. In some examples, the method may include selecting the second ferroelectric memory cell of a second deck of ferroelectric memory cells by applying the second voltage to the second access line that may be coupled with the second deck of ferroelectric memory cells. In some examples, the second voltage may be applied after applying the first voltage. Additionally or alternatively, for example, the method may include accessing the second ferroelectric memory cell of the second deck of ferroelectric memory cells by reducing the second voltage applied to the second access line to the third voltage lower than the second voltage. In some examples, the fourth voltage and the fixed voltage may include a negative voltage.

In some examples, the memory controller may support means for applying a first voltage to the plate line and the first access line. In other examples, the memory controller may support means for applying a second voltage to the second access line to select the second ferroelectric memory cell. Additionally or alternatively, for example, the memory controller may support means for reducing the second voltage to a third voltage to access the second ferroelectric memory cell. In other examples, the memory controller may support means for removing the applied second voltage after accessing the second ferroelectric memory cell. In some examples, the memory controller may support means for applying a recovery pulse, after the removal of the applied second voltage, to discharge a ferroelectric capacitor of the second ferroelectric memory cell. Additionally or alternatively, for example, the memory controller may support means for applying the first voltage to the plate line and the first access line until the removal of the applied second voltage.

It should be noted that the methods described above describe possible implementations, and that the operations and the steps may be rearranged or otherwise modified and that other implementations are possible. Furthermore, examples from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
setting a first voltage of a plate that is coupled with a first memory cell and a second memory cell, wherein the first memory cell is coupled with a first digit line;
isolating the first digit line from a second digit line that is coupled with the second memory cell based at least in part on setting the first voltage of the plate;
coupling the plate with the second digit line, wherein the first voltage is applied to the second digit line based at least in part on the coupling and is not applied to the first digit line based at least in part on the isolating; and
applying, based at least in part on coupling the plate with the second digit line and isolating the first digit line from the second digit line, a second voltage to a word line that is coupled with the first memory cell and the second memory cell, and a third voltage to the first digit line.

2. The method of claim 1, further comprising:
performing an access operation associated with the first memory cell, wherein the plate is set to the first voltage, the plate is coupled with the second digit line, and the second voltage is applied to the word line as part of the access operation, and wherein, after the plate is coupled with the second digit line, the plate and the second digit line operate at a fixed voltage level for a remainder of the access operation.

3. The method of claim 1, wherein the first memory cell comprises a first selection component and the second memory cell comprises a second selection component, the plate is coupled with the second digit line via a switching component, and the word line is coupled with the first selection component of the first memory cell and the second selection component of the second memory cell.

4. The method of claim 1, further comprising:
executing a precharge command that comprises:
applying, after applying the second voltage and the third voltage, a fourth voltage to the word line and a fifth voltage to the first digit line.

5. The method of claim 1, wherein the first digit line is coupled with a third memory cell that comprises a storage element, and wherein a bottom of the storage element is charged based at least in part on applying the third voltage to the first digit line.

6. The method of claim 1, further comprising:
applying, after applying the second voltage and the third voltage, a fourth voltage to the word line and a fifth voltage to the first digit line; and
maintaining the coupling between the plate and the second digit line after the fourth voltage is applied to the word line and the fifth voltage is applied to the first digit line.

7. The method of claim 6, further comprising:
applying, before applying the second voltage and the third voltage, a sixth voltage having a negative polarity to the word line, wherein the first voltage applied to the plate has a ground reference voltage, the second voltage applied to the word line has a positive polarity, the third voltage applied to the first digit line has the positive polarity and is smaller than the second voltage, the fourth voltage applied to the word line has the positive polarity and is smaller than the second voltage, and the fifth voltage applied to the first digit line has the ground reference voltage.

8. A method, comprising:
setting a first voltage of a plate that is coupled with a first memory cell and a second memory cell, wherein the first memory cell is coupled with a first digit line;
coupling the plate with a second digit line that is coupled with the second memory cell, wherein the first voltage is applied to the second digit line based at least in part on the coupling;
applying, based at least in part on coupling the plate with the second digit line, a second voltage to a word line that is coupled with the first memory cell and the second memory cell, and a third voltage to the first digit line; and
executing a precharge command that comprises:
applying, after applying the second voltage and the third voltage, a fourth voltage to the word line and a fifth voltage to the first digit line, wherein the fourth voltage has a positive polarity and the fifth voltage has a negative polarity based at least in part on a logic state of the first memory cell, and wherein a storage element of a third memory cell that is coupled with the first digit line is discharged based at least in part on the applying the fifth voltage to the first digit line.

9. A method, comprising:
setting a first voltage of a plate that is coupled with a first memory cell and a second memory cell, wherein the first memory cell is coupled with a first digit line;
coupling the plate with a second digit line that is coupled with the second memory cell, wherein the first voltage is applied to the second digit line based at least in part on the coupling;
applying, based at least in part on coupling the plate with the second digit line, a second voltage to a word line that is coupled with the first memory cell and the second memory cell, and a third voltage to the first digit line; and
executing a precharge command that comprises:
applying, after applying the second voltage and the third voltage, a fourth voltage to the word line and a fifth voltage to the first digit line, wherein the fourth voltage has a positive polarity and the fifth voltage has a ground reference voltage based at least in part on a logic state of the first memory cell, and wherein a storage element of a third memory cell that is coupled with the first digit line remains charged based at least in part on the applying the fifth voltage to the first digit line, the method further comprising:
applying, after executing the precharge command, a sixth voltage to the first digit line having a negative polarity and a seventh voltage to the word line having the negative polarity, wherein the storage element of the third memory cell is discharged based at least in part on applying the sixth voltage to the first digit line.

10. A method, comprising:
executing an activation command for a first memory cell;
setting a first voltage of a plate that is coupled with the first memory cell and a second memory cell, wherein the first memory cell is coupled with a first digit line, and wherein the first voltage is applied to the plate based at least in part on executing the activation command;
coupling the plate with a second digit line that is coupled with the second memory cell, wherein the first voltage is applied to the second digit line based at least in part on the coupling, and wherein the plate is coupled with the second digit line based at least in part on executing the activation command;
applying, based at least in part on coupling the plate with the second digit line, a second voltage to a word line that is coupled with the first memory cell and the second memory cell, and a third voltage to the first digit line, wherein the second voltage is applied to the word line based at least in part on executing the activation command;
executing a sequence comprising read commands, write commands, or both for the first memory cell after executing the activation command;
executing a precharge command based at least in part on a logic state stored by the first memory cell after a last command of the sequence; and
performing, after executing the precharge command, a discharge operation based at least in part on a voltage applied to the first digit line during a precharge operation associated with the precharge command.

11. A method, comprising:
determining, as part of a precharge operation, a logic state of a memory cell that is coupled with a digit line based at least in part on a precharge command;
applying, as part of the precharge operation, a first voltage to the digit line based at least in part on the logic state of the memory cell; and applying, after a completion of the precharge operation, a second voltage to the digit line that is different than the first voltage based at least in part on the logic state of the memory cell, wherein:

the first voltage has a negative polarity and the second voltage has a ground reference voltage based at least in part on determining the logic state of the memory cell is associated with a first logic value; or the first voltage has the ground reference voltage and the second voltage has the negative polarity based at least in part on determining the logic state of the memory cell is associated with a second logic value.

12. The method of claim 11, further comprising:
performing a discharge operation after the completion of the precharge operation, wherein the second voltage is applied to the digit line as part of the discharge operation.

13. The method of claim 11, wherein the memory cell is coupled with a word line, the method further comprising:
applying, after the completion of the precharge operation, a third voltage to the word line that has the negative polarity.

14. A method, comprising:
determining, as part of a precharge operation, a logic state of a memory cell that is coupled with a digit line based at least in part on a precharge command;
applying, as part of the precharge operation, a first voltage to the digit line based at least in part on the logic state of the memory cell;
writing the logic state determined for the memory cell back to the memory cell based at least in part on the first voltage being applied to the digit line during the precharge operation; and
applying, after a completion of the precharge operation, a second voltage to the digit line that is different than the first voltage based at least in part on the logic state of the memory cell, wherein a second memory cell that is coupled with the digit line is discharged based at least in part on applying one of the first voltage or the second voltage to the digit line.

15. A memory system, comprising:
one or more memory devices; and
one or more controllers coupled with the one or more memory devices and configured to cause the memory system to:
set a first voltage of a plate that is coupled with a first memory cell and a second memory cell, wherein the first memory cell is coupled with a first digit line;
isolate the first digit line from a second digit line that is coupled with the second memory cell based at least in part on setting the first voltage of the plate;
couple the plate with the second digit line, wherein the first voltage is applied to the second digit line based at least in part on the coupling and is not applied to the first digit line based at least in part on the isolating; and
apply, based at least in part on coupling the plate with the second digit line and isolating the first digit line from the second digit line, a second voltage to a word line that is coupled with the first memory cell and the second memory cell, and a third voltage to the first digit line.

16. The memory system of claim 15, wherein the one or more controllers are further configured to cause the memory system to:
perform an access operation associated with the first memory cell, wherein the plate is set to the first voltage, the plate is coupled with the second digit line, and the second voltage is applied to the word line as part of the access operation, and wherein, after the plate is coupled with the second digit line, the plate and the second digit line operate at a fixed voltage level for a remainder of the access operation.

17. The memory system of claim 15, wherein the first memory cell comprises a first selection component and the second memory cell comprises a second selection component, the plate is coupled with the second digit line via a switching component, and the word line is coupled with the first selection component of the first memory cell and the second selection component of the second memory cell.

18. The memory system of claim 15, wherein the one or more controllers are further configured to cause the memory system to:
execute a precharge command that comprises:
applying, after applying the second voltage and the third voltage, a fourth voltage to the word line and a fifth voltage to the first digit line.

19. A non-transitory computer-readable medium storing code comprising instructions which, when executed by one or more processors of an electronic device, cause the electronic device to:
set a first voltage of a plate that is coupled with a first memory cell and a second memory cell, wherein the first memory cell is coupled with a first digit line;
isolate the first digit line from a second digit line that is coupled with the second memory cell based at least in part on setting the first voltage of the plate;
couple the plate with the second digit line, wherein the first voltage is applied to the second digit line based at least in part on the coupling and is not applied to the first digit line based at least in part on the isolating; and
apply, based at least in part on coupling the plate with the second digit line and isolating the first digit line from the second digit line, a second voltage to a word line that is coupled with the first memory cell and the second memory cell, and a third voltage to the first digit line.

* * * * *